(12) United States Patent
Nishihara et al.

(10) Patent No.: US 8,559,799 B2
(45) Date of Patent: *Oct. 15, 2013

(54) HEAT TREATMENT APPARATUS AND METHOD FOR HEATING SUBSTRATE BY PHOTO-IRRADIATION

(75) Inventors: Hideo Nishihara, Kyoto (JP); Shinichi Kato, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 763 days.

This patent is subject to a terminal disclaimer.

(21) Appl. No.: 12/563,409

(22) Filed: Sep. 21, 2009

(65) Prior Publication Data

US 2010/0111513 A1    May 6, 2010

(30) Foreign Application Priority Data

Nov. 4, 2008  (JP) ................................. 2008-283294
Jun. 4, 2009  (JP) ................................. 2009-135398

(51) Int. Cl.
*F26B 19/00*    (2006.01)
(52) U.S. Cl.
USPC .......................................... 392/418; 438/522
(58) Field of Classification Search
None
See application file for complete search history.

(56) References Cited

U.S. PATENT DOCUMENTS

| | | | |
|---|---|---|---|
| 6,613,399 B2 * | 9/2003 | Miyamoto et al. | 427/558 |
| 6,936,797 B2 | 8/2005 | Hosokawa | 219/405 |
| 6,998,580 B2 | 2/2006 | Kusuda et al. | 219/411 |
| 7,381,928 B2 | 6/2008 | Kusuda et al. | |
| 7,887,533 B2 * | 2/2011 | Barolet et al. | 606/9 |
| 7,914,523 B2 * | 3/2011 | Barolet et al. | 606/9 |
| 7,981,780 B2 * | 7/2011 | Kato | 438/522 |
| 8,041,198 B2 * | 10/2011 | Kiyama et al. | 392/418 |
| 8,145,046 B2 * | 3/2012 | Kiyama et al. | 392/418 |
| 8,173,937 B2 | 5/2012 | Yokouchi | |
| 2009/0166351 A1 | 7/2009 | Yokomori | |

FOREIGN PATENT DOCUMENTS

| | | |
|---|---|---|
| JP | 2002-252174 | 9/2002 |
| JP | 2008-198674 | 8/2008 |
| JP | 2009-164201 | 7/2009 |

OTHER PUBLICATIONS

Office Action issued by Japanese Patent Office on Jun. 18, 2013 in connection with corresponding Japanese Patent Application No. 2008-283294 and partial translation thereof.

* cited by examiner

*Primary Examiner* — Thor Campbell
(74) *Attorney, Agent, or Firm* — Ostrolenk Faber LLP

(57) ABSTRACT

Two-step photo-irradiation heat treatment is performed so that a total photo-irradiation time is not more than one second and that a first step of photo-irradiation of a semiconductor wafer is performed with a light-emission output that averages out at a first light-emission output and a second step of photo-irradiation of the semiconductor wafer is performed in accordance with an output waveform that peaks at a second light-emission output that is higher than both average and maximum light-emission outputs in the first step. Performing preliminary photo-irradiation with a relatively low light-emission output in the first step and then performing intense photo-irradiation with a higher peak in the second step enables the surface temperature of a semiconductor wafer to increase further with a smaller amount of energy than in conventional cases, while preventing the semiconductor wafer from shattering.

15 Claims, 15 Drawing Sheets

F I G . 4
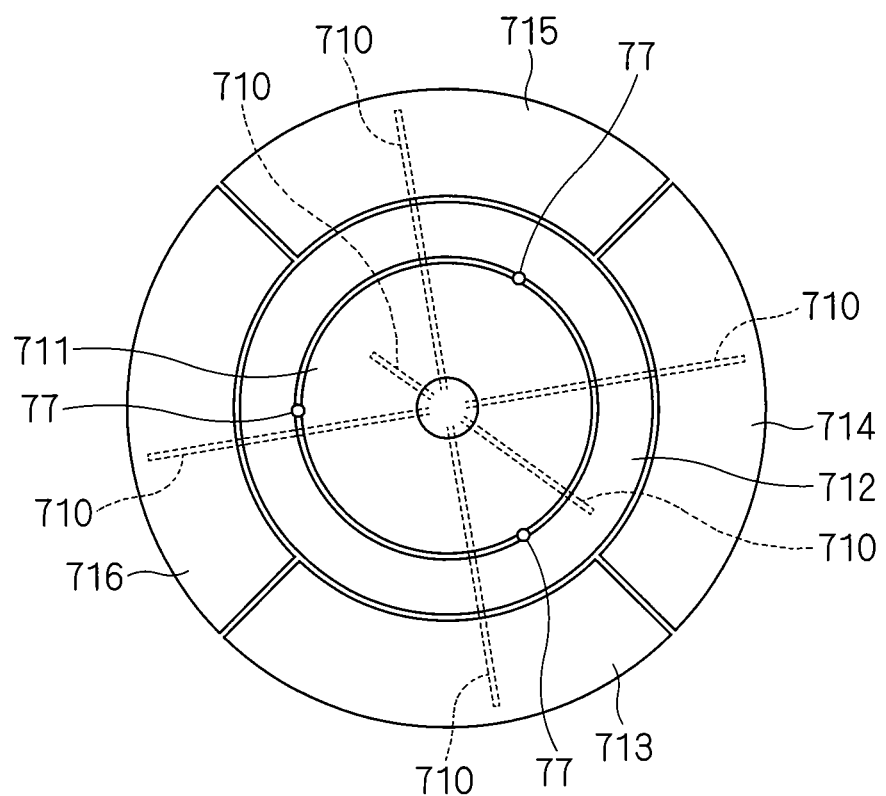

HEAT TREATMENT APPARATUS AND METHOD FOR HEATING SUBSTRATE BY PHOTO-IRRADIATION

BACKGROUND OF THE INVENTION

1. Field of the Invention

The present invention relates to a heat treatment apparatus and method for heating a thin plate-like precision electronic substrate such as a semiconductor wafer and a glass substrate for liquid crystal display (hereinafter referred to simply as a "substrate") by irradiating the substrate with light.

2. Description of the Background Art

Conventionally, a lamp annealer employing halogen lamps has been commonly used in the step of activating ions in a semiconductor wafer after ion implantation (impurity doping). Such a lamp annealer carries out the activation of ions in a semiconductor wafer by heating (or annealing) the semiconductor wafer to a temperature of approximately 1000 to 1100° C., for example. In such a heat treatment apparatus, the energy of the light emitted from halogen lamps is used to raise the substrate temperature at a rate of about several hundred degrees per second.

In recent years, with the increasing integration of semiconductor devices, it has been desired that junctions be made shallower with decreasing gate length. It has, however, transpired that even if the above lamp annealer, which raises the temperature of a semiconductor wafer at a rate of about several hundred degrees per second, is used to carry out the activation of ions in a semiconductor wafer, a phenomenon still occurs where boron, phosphorous, or other ions implanted in the semiconductor wafer are deeply heat diffused. The occurrence of such a phenomenon gives rise to the apprehension that the junction may become deeper than the desired level, hindering good device formation.

With regard to this, U.S. Pat. Nos. 6,998,580 and 6,936,797 disclose techniques for raising only the surface temperature of an ion-impregnated semiconductor wafer within an extremely short period of time (several milliseconds or less) by irradiating the surface of the semiconductor wafer with flashes of light from xenon flash lamps (the term "flash lamp" as used hereinafter refers to a "xenon flash lamp"). The xenon flash lamps have a spectral distribution of radiation ranging from ultraviolet to near-infrared regions. The wavelength of the light emitted from xenon flash lamps is shorter than that of the light emitted from conventional halogen lamps, and it almost coincides with the fundamental absorption band of a silicon semiconductor wafer. Thus, when a semiconductor wafer is irradiated with the flashes of light emitted from xenon flash lamps, the temperature of the semiconductor wafer can be raised rapidly with only a small amount of light transmitted through the semiconductor wafer. It has also transpired that the flashes of light emitted within an extremely short period of time such as several milliseconds or less allow a selective temperature rise only near the surface of a semiconductor wafer. Such an extremely quick temperature rise with xenon flash lamps will allow only the ion activation to be implemented without deep diffusion of the ions Now, a typical measure of the properties of ion-implanted semiconductor wafers that is used is a sheet resistance value Rs. Since the activation of ions reduces a sheet resistance value on the surface of a semiconductor wafer W, a lower sheet resistance value generally indicates better execution of ion activation. For this reason, a further reduction in the sheet resistance value is desired. For a lower sheet resistance value, the surface temperature of a semiconductor wafer may be increased.

However, in order to further increase the ultimate surface temperature of a semiconductor wafer with the emission of flashes of light from flash lamps, it is necessary to emit flashes of light with greater irradiation energy within an extremely short period of time, which must result in an increase in the loads of both flash lamps and their driving circuits. Consequently, there is also a problem of shortening the lifetimes of such flash lamps.

Another problem also arises in that if flashes of light with a huge irradiation energy are emitted for an extremely short period of time so that the surface temperature of a semiconductor wafer is significantly increased instantaneously, sudden thermal expansion may occur only on the wafer surface, causing the semiconductor wafer to shatter.

SUMMARY OF THE INVENTION

The present invention is directed to a heat treatment method for heating a substrate by irradiating the substrate with light.

According to an aspect of the invention, the heat treatment method includes the following steps: a first photo-irradiation step of performing photo-irradiation of a substrate with a light-emission output that averages out at a first light-emission output; and a second photo-irradiation step, subsequent to the first photo-irradiation step, of performing photo-irradiation of the substrate in accordance with an output waveform that peaks at a second light-emission output that is higher than the first light-emission output and a maximum light-emission output in the first photo-irradiation step, wherein a total of a photo-irradiation time in the first photo-irradiation step and a photo-irradiation time in the second photo-irradiation step is not more than one second.

Since intense irradiation with a higher peak is applied after the execution of the preliminary heating of a substrate with a relatively low light-emission output, it is possible to further increase the surface temperature of the substrate while preventing the substrate from shattering.

According to another aspect of the invention, the heat treatment method includes the following steps: a weak irradiation step of performing photo-irradiation of a substrate with a light-emission output that averages out at a first light-emission output and that is kept for 5 to 100 milliseconds within a fluctuation range of plus or minus 30% from the first light-emission output; a buffer irradiation step, subsequent to the weak irradiation step, of performing photo-irradiation of the substrate with a light-emission output that increases from the first light-emission output to a second light-emission output that is higher than the first light-emission output over a time in a range of 5 to 50 milliseconds; and an intense irradiation step, subsequent to the buffer irradiation step, of performing photo-irradiation of the substrate in accordance with an output waveform that peaks at a third light-emission output that is higher than the second light-emission output and whose irradiation time is between 1 and 5 milliseconds, wherein a rate of increase of the light-emission output in the buffer irradiation step is between 10 and 40% of a rate of increase of the light-emission output until the light-emission output reaches a peak in the intense irradiation step.

Since intense irradiation is applied to a substrate that has been preheated to some extent by weak irradiation, the surface temperature of the substrate can be further increased. In addition, the execution of the buffer irradiation step between the weak irradiation step and the intense irradiation step reduces the range of an instantaneous increase in the surface temperature of the substrate at the time of the intense irradiation, thus reducing thermal damage to the substrate and preventing the substrate from shattering.

Preferably, the photo-irradiation of a substrate is performed with a flash lamp, power is supplied from a first capacitor to the flash lamp in the weak irradiation step and in the buffer irradiation step, and power is also supplied from a second capacitor, as well as the first capacitor, to the flash lamp in the intense irradiation step.

This ensures the acquisition of a light-emission output that is necessary to reach the peak of the intense irradiation.

Alternatively, according to another aspect, the heat treatment method includes the following steps: a buffer irradiation step of performing photo-irradiation of a substrate with a light-emission output that increases up to a first light-emission output over a time in a range of 1 to 100 milliseconds; and an intense irradiation step, subsequent to the buffer irradiation step, of performing photo-irradiation of the substrate in accordance with an output waveform that peaks at a second light-emission output that is higher than the first light-emission output and whose irradiation time is between 1 and 5 milliseconds, wherein a rate of increase of the light-emission output in the buffer irradiation step is between 10 and 40% of a rate of increase of the light-emission output until the light-emission output reaches a peak in the intense irradiation step.

Since intense irradiation is applied to a substrate that has been preheated to some extent by the buffer irradiation, the surface temperature of the substrate can be further increased. In addition, the execution of the buffer irradiation step preliminary to the intense irradiation step reduces the range of an instantaneous increase in the surface temperature of the substrate at the time of the intense irradiation, thus reducing thermal damage to the substrate and preventing the substrate from shattering.

Alternatively, according to another aspect, the heat treatment method includes the following steps: a weak irradiation step of performing photo-irradiation of a substrate with a light-emission output that averages out at a first light-emission output and that is kept for 5 to 100 milliseconds within a fluctuation range of plus or minus 30% from the first light-emission output; a buffer irradiation step, subsequent to the weak irradiation step, of performing photo-irradiation of the substrate with a light-emission output that increases from the first light-emission output to a second light-emission output that is higher than the first light-emission output over a time in a range of 5 to 50 milliseconds; and an intense irradiation step, subsequent to the buffer irradiation step, of performing photo-irradiation of the substrate with a light-emission output that averages out at the second light-emission output and that is kept for 1 to 10 milliseconds within a fluctuation range of plus or minus 30% from the second light-emission output.

Since intense irradiation is applied to a substrate that has been preheated to some extent by the weak irradiation, the surface temperature of the substrate can be further increased. In addition, the execution of the buffer irradiation step between the weak irradiation step and the intense irradiation step reduces the range of an instantaneous increase in the surface temperature of the substrate at the time of the intense irradiation, thus reducing thermal damage to the substrate and preventing the substrate from shattering.

Alternatively, according to another aspect, the heat treatment method includes the following steps: a buffer irradiation step of performing photo-irradiation of a substrate with a light-emission output that increases up to a first light-emission output over a time in a range of 1 to 100 milliseconds; and an intense irradiation step, subsequent to the buffer irradiation step, of performing photo-irradiation of the substrate with a light-emission output that averages out at the first light-emission output and that is kept for 1 to 10 milliseconds within a fluctuation range of plus or minus 30% from the first light-emission output.

Since intense irradiation is applied to a substrate that has been preheated to some extent by the buffer irradiation, the surface temperature of the substrate can be further increased. In addition, the execution of the buffer irradiation step preliminary to the intense irradiation step reduces the range of an instantaneous increase in the surface temperature of the substrate at the time of the intense irradiation, thus reducing thermal damage to the substrate and preventing the substrate from shattering.

Alternatively, according to another aspect, the heat treatment method includes the following steps: a weak irradiation step of performing photo-irradiation of a substrate with a light-emission output that averages out at a first light-emission output and that is kept for 5 to 100 milliseconds within a fluctuation range of plus or minus 30% from the first light-emission output; a buffer irradiation step, subsequent to the weak irradiation step, of performing photo-irradiation of the substrate with a light-emission output that increases from the first light-emission output to a second light-emission output that is higher than the first light-emission output over a time in a range of 5 to 50 milliseconds; an intense irradiation step, subsequent to the buffer irradiation step, of performing photo-irradiation of the substrate with a light-emission output that averages out at the second light-emission output and that is kept for 5 to 10 milliseconds within a fluctuation range of plus or minus 30% from the second light-emission output; and an additional irradiation step, subsequent to the intense irradiation step, of performing photo-irradiation of the substrate with a light-emission output that averages out at a third light-emission output that is lower than the second light-emission output and that is kept for 10 to 100 milliseconds within a fluctuation range of plus or minus 30% from the third light-emission output.

Since intense irradiation is applied to a substrate that has been preheated to some extent by the weak irradiation, the surface temperature of the substrate can be further increased. In addition, the execution of the buffer irradiation step between the weak irradiation step and the intense irradiation step reduces the range of an instantaneous increase in the surface temperature of the substrate at the time of the intense irradiation, thus reducing thermal damage to the substrate and preventing the substrate from shattering. Still more, the execution of the additional irradiation step allows the surface temperature of the substrate to drop over a certain period of time, thus enabling the recovery of defects that have been introduced into the substrate.

Alternatively, according to another aspect, the heat treatment method includes the following steps: a buffer irradiation step of performing photo-irradiation of a substrate with a light-emission output that increases up to a first light-emission output over a time in the range of 1 to 100 milliseconds; an intense irradiation step, subsequent to the buffer irradiation step, of performing photo-irradiation of the substrate with a light-emission output that averages out at the first light-emission output and that is kept for 5 to 10 milliseconds within a fluctuation range of plus or minus 30% from the first light-emission output; and an additional irradiation step, subsequent to the intense irradiation step, of performing photo-irradiation of the substrate with a light-emission output that averages out at a second light-emission output that is lower than the first light-emission output and that is kept for 10 to 100 milliseconds within a fluctuation range of plus or minus 30% from the second light-emission output.

Since intense irradiation is applied to a substrate that has been preheated to some extent by the buffer irradiation, the surface temperature of the substrate can be further increased. In addition, the execution of the buffer irradiation step preliminary to the intense irradiation step reduces the range of an instantaneous increase in the surface temperature of the substrate at the time of the intense irradiation, thus reducing thermal damage to the substrate and preventing the substrate from shattering. Still more, the execution of the additional irradiation step allows the surface temperature of the substrate to drop over a certain period of time, thus enabling the recovery of defects that have been introduced into the substrate.

The present invention is also directed to a heat treatment apparatus for heating a substrate by irradiating the substrate with light.

According to another aspect of the invention, the heat treatment apparatus includes the following: a holder that holds a substrate; a photo-irradiation unit that irradiates a substrate held by the holder with light; and a light-emission control unit that controls a light-emission output of the photo-irradiation unit, the light-emission control unit being configured to control the light-emission output of the photo-irradiation unit so that a total photo-irradiation time is not more than one second and that a first photo-irradiation of a substrate is performed with a light-emission output that averages out at a first light-emission output, and then a second photo-irradiation of the substrate is performed in accordance with an output waveform that peaks at a second light-emission output that is higher than both the first light-emission output and a maximum light-emission output of the first photo-irradiation.

Since intense irradiation with a higher peak is applied after the execution of the preliminary heating of a substrate with a relatively low light-emission output, it is possible to further increase the surface temperature of the substrate while preventing the substrate from shattering.

According to another aspect of the invention, the heat treatment apparatus includes the following: a holder that holds a substrate; a photo-irradiation unit that irradiates a substrate held by the holder with light; and a light-emission control unit that controls a light-emission output of the photo-irradiation unit, the light-emission control unit being configured to control the light-emission output of the photo-irradiation unit so that weak irradiation of a substrate is performed with a light-emission output that averages out at a first light-emission output and that is kept for 5 to 100 milliseconds within a fluctuation range of plus or minus 30% from the first light-emission output, then buffer irradiation of the substrate is performed with a light-emission output that increases from the first light-emission output to a second light-emission output that is higher than the first light-emission output over a time in a range of 5 to 50 milliseconds, and then intense irradiation of the substrate is performed in accordance with an output waveform that peaks at a third light-emission output that is higher than the second light-emission output and whose irradiation time is between 1 and 5 milliseconds; wherein a rate of increase of the light-emission output in the buffer irradiation is between 10 and 40% of a rate of increase of the light-emission output until the light-emission output reaches a peak in the intense irradiation.

Since intense irradiation is applied to a substrate that has been preheated to some extent by weak irradiation, the surface temperature of the substrate can be further increased. In addition, the execution of the buffer irradiation step between the weak irradiation step and the intense irradiation step reduces the range of an instantaneous increase in the surface temperature of the substrate at the time of the intense irradiation, thus reducing thermal damage to the substrate and preventing the substrate from shattering.

Preferably, the photo-irradiation unit includes a flash lamp. The heat treatment apparatus further includes: a first capacitor that supplies power to the flash lamp at the time of execution of the weak irradiation and the buffer irradiation; and a second capacitor that, together with the first capacitor, supplies power to the flash lamp at the time of execution of the intense irradiation.

This ensures the acquisition of a light-emission output that is necessary to reach the peak of the intense irradiation.

Alternatively, according to another aspect, the heat treatment apparatus includes the following: a holder that holds a substrate; a photo-irradiation unit that irradiates a substrate held by the holder with light; and a light-emission control unit that controls a light-emission output of the photo-irradiation unit, the light-emission control unit being configured to control the light-emission output of the photo-irradiation unit so that buffer irradiation of a substrate is performed with a light-emission output that increases up to a first light-emission output over a time in a range of 1 to 100 milliseconds, and then intense irradiation of the substrate is performed in accordance with an output waveform that peaks at a second light-emission output that is higher than the first light-emission output and whose irradiation time is between 1 and 5 milliseconds, wherein a rate of increase of the light-emission output in the buffer irradiation is between 10 and 40% of a rate of increase of the light-emission output until the light-emission output reaches a peak in the intense irradiation.

Since intense irradiation is applied to a substrate that has been preheated to some extent by the buffer irradiation, the surface temperature of the substrate can be further increased. In addition, the execution of the buffer irradiation preliminary to the intense irradiation reduces the range of an instantaneous increase in the surface temperature of the substrate at the time of the intense irradiation, thus reducing thermal damage to the substrate and preventing the substrate from shattering.

Alternatively, according to another aspect, the heat treatment apparatus includes the following: a holder that holds a substrate; a photo-irradiation unit that irradiates a substrate held by the holder with light; and a light-emission control unit that controls a light-emission output of the photo-irradiation unit, the light-emission control unit being configured to control the light-emission output of the photo-irradiation unit so that weak irradiation of a substrate is performed with a light-emission output that averages out at a first light-emission output and that is kept for 5 to 100 milliseconds within a fluctuation range of plus or minus 30% from the first light-emission output, then buffer irradiation of the substrate is performed with a light-emission output that increases from the first light-emission output to a second light-emission output that is higher than the first light-emission output over a time in the range of 5 to 50 milliseconds, and then intense irradiation of the substrate is performed with a light-emission output that averages out at the second light-emission output and that is kept for 1 to 10 milliseconds within a fluctuation range of plus or minus 30% from the second light-emission output.

Since intense irradiation is applied to a substrate that has been preheated to some extent by the weak irradiation, the surface temperature of the substrate can be further increased. In addition, the execution of buffer irradiation between the weak irradiation and the intense irradiation reduces the range of an instantaneous increase in the surface temperature of the substrate at the time of the intense irradiation, thus reducing thermal damage to the substrate and preventing the substrate from shattering.

Alternatively, according to another aspect, the heat treatment apparatus includes the following: a holder that holds a substrate; a photo-irradiation unit that irradiates a substrate held by the holder with light; and a light-emission control unit that controls a light-emission output of the photo-irradiation unit, the light-emission control unit being configured to control the light-emission output of the photo-irradiation unit so that buffer irradiation of a substrate is performed with a light-emission output that increases up to a first light-emission output over a time in a range of 1 to 100 milliseconds, and then intense irradiation of the substrate is performed with a light-emission output that averages out at the first light-emission output and that is kept for 1 to 10 milliseconds within a fluctuation range of plus or minus 30% from the first light-emission output.

Since intense irradiation is applied to a substrate that has been preheated to some extent by the buffer irradiation, the surface temperature of the substrate can be further increased. In addition, the execution of buffer irradiation preliminary to the intense irradiation reduces the range of an instantaneous increase in the surface temperature of the substrate at the time of the intense irradiation, thus reducing thermal damage to the substrate and preventing the substrate from shattering.

Alternatively, according to another aspect, the heat treatment apparatus includes the following: a holder that holds a substrate; a photo-irradiation unit that irradiates a substrate held by the holder with light; and a light-emission control unit that controls a light-emission output of the photo-irradiation unit, the light-emission control unit being configured to control the light-emission output of the photo-irradiation unit so that weak irradiation of a substrate is performed with a light-emission output that averages out at a first light-emission output and that is kept for 5 to 100 milliseconds within a fluctuation range of plus or minus 30% from the first light-emission output, then buffer irradiation of the substrate is performed with a light-emission output that increases from the first light-emission output to a second light-emission output that is higher than the first light-emission output over a time in a range of 5 to 50 milliseconds, then intense irradiation of the substrate is performed with a light-emission output that averages out at the second light-emission output and that is kept for 5 to 10 milliseconds within a fluctuation range of plus or minus 30% from the second light-emission output, and then additional photo-irradiation of the substrate is performed with a light-emission output that averages out at a third light-emission output that is lower than the second light-emission output and that is kept for 10 to 100 milliseconds within a fluctuation range of plus or minus 30% from the third light-emission output.

Since intense irradiation is applied to a substrate that has been preheated to some extent by the weak irradiation, the surface temperature of the substrate can be further increased. In addition, the execution of buffer irradiation between the weak irradiation and the intense irradiation reduces the range of an instantaneous increase in the surface temperature of the substrate at the time of the intense irradiation, thus reducing thermal damage to the substrate and preventing the substrate from shattering. Still more, the execution of additional irradiation allows the surface temperature of the substrate to drop over a certain period of time, thus enabling the recovery of defects that have been introduced into the substrate.

Alternatively, according to another aspect, the heat treatment apparatus includes the following: a holder that holds a substrate; a photo-irradiation unit that irradiates a substrate held by the holder with light; and a light-emission control unit that controls a light-emission output of the photo-irradiation unit, the light-emission control unit being configured to control the light-emission output of the photo-irradiation unit so that buffer irradiation of a substrate is performed with a light-emission output that increases up to a first light-emission output over a time in a range of 1 to 100 milliseconds, then intense irradiation of the substrate is performed with a light-emission output that averages out at the first light-emission output and that is kept for 5 to 10 milliseconds within a fluctuation range of plus or minus 30% from the first light-emission output, and then additional photo-irradiation of the substrate is performed with a light-emission output that averages out at a second light-emission output that is lower than the first light-emission output and that is kept for 10 to 100 milliseconds within a fluctuation range of plus or minus 30% from the second light-emission output.

Since intense irradiation is applied to a substrate that has been preheated to some extent by the buffer irradiation, the surface temperature of the substrate can be further increased. In addition, the execution of buffer irradiation preliminary to the intense irradiation reduces the range of an instantaneous increase in the surface temperature of the substrate at the time of the intense irradiation, thus reducing thermal damage to the substrate and preventing the substrate from shattering. Still more, the execution of additional irradiation allows the surface temperature of the substrate to drop over a certain period of time, thus enabling the recovery of defects that have been introduced into the substrate.

An object of the present invention is thus to further increase the surface temperature of a substrate while preventing the substrate from shattering.

These and other objects, features, aspects and advantages of the invention will become more apparent from the following detailed description of the invention when taken in conjunction with the accompanying drawings.

BRIEF DESCRIPTION OF THE DRAWING

FIG. 4 is a plan view of a hot plate.

DESCRIPTION OF THE PREFERRED EMBODIMENTS

Now, preferred embodiments of the invention will be described in detail with reference to the drawings.

First Preferred Embodiment

Figure 1:
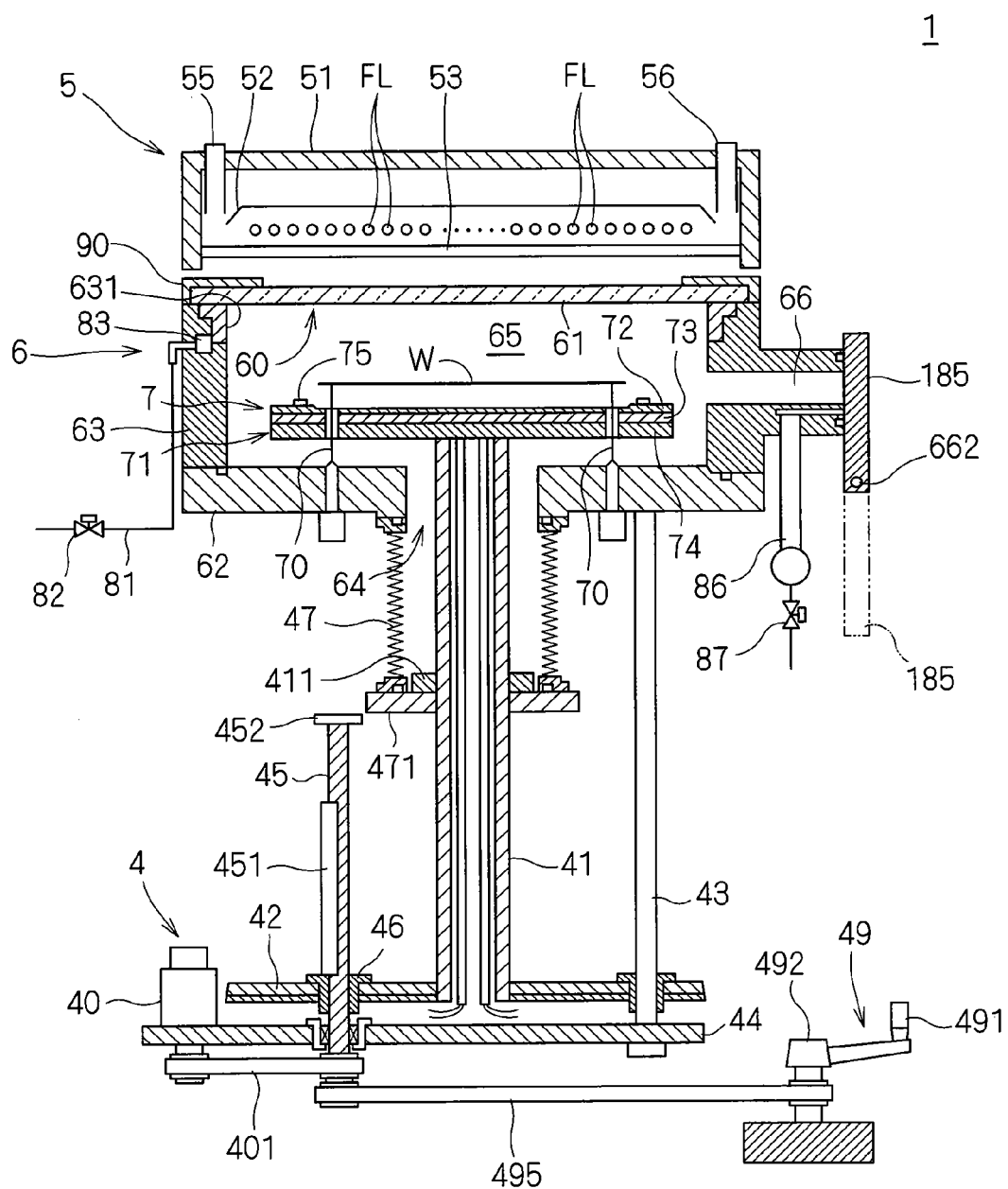
FIG. 1 illustrates a longitudinal section of a configuration of a heat treatment apparatus according to the present invention.

First, a general configuration of a heat treatment apparatus according to the invention is outlined. FIG. 1 illustrates a longitudinal section of a configuration of a heat treatment apparatus 1 according to the invention. The heat treatment apparatus 1 is a lamp annealer for applying light to a generally disc-shaped semiconductor wafer W serving as a substrate so as to heat the semiconductor wafer W.

The heat treatment apparatus 1 includes a generally cylindrical chamber 6 for receiving a semiconductor wafer W therein; and a lamp house 5 including a plurality of built-in flash lamps FL. The heat treatment apparatus 1 further includes a controller 3 for controlling each operating mechanism provided in the chamber 6 and in the lamp house 5 for the implementation of the heat treatment of a semiconductor wafer W.

The chamber 6 is located below the lamp house 5 and includes a chamber side portion 63 having a generally cylindrical inner wall and a chamber bottom portion 62 covering the bottom of the chamber side portion 63. A space surrounded by the chamber side portion 63 and the chamber bottom portion 62 is defined as a heat treatment space 65. Above the heat treatment space 65 is a top opening 60 equipped with and blocked by a chamber window 61.

The chamber window 61 forming the ceiling of the chamber 6 is a disk-shaped member made of quartz and serves as a quartz window that transmits light emitted from the lamp house 5 into the heat treatment space 65. The chamber bottom portion 62 and the chamber side portion 63, which form the main body of the chamber 6, are made of, for example, a metal material such as stainless steel with high strength and high heat resistance; and an upper ring 631 on the inner side face of the chamber side portion 63 is made of an aluminum (Al) alloy or the like with greater durability than stainless steel against degradation due to light emission.

In order to maintain the hermetic state of the heat treatment space 65, the chamber window 61 and the chamber side portion 63 are sealed with an O-ring. To be more specific, an O-ring is inserted between an underside peripheral portion of the chamber window 61 and the chamber side portion 63, and a clamp ring 90 is provided to abut against an upper-side peripheral portion of the chamber window 61 and to be screwed to the chamber side portion 63, thereby forcing the chamber window 61 onto the O-ring.

The chamber bottom portion 62 has a plurality of (three, in this preferred embodiment) support pins 70 extending upright therefrom through a holder 7 in order to support a semiconductor wafer W from the underside (the surface opposite the surface receiving light from the lamp house 5) of the semiconductor wafer W. The support pins 70 are made of, for example, quartz and can be replaced easily because they are secured from outside the chamber 6.

The chamber side portion 63 has a transport opening 66 for the transport of a semiconductor wafer W. The transport opening 66 is openable and closable by a gate valve 185 that pivots about an axis 662. On the opposite side of the chamber side portion 63 from the transport opening 66, an inlet passage 81 is formed, which introduces a processing gas (e.g., an inert gas such as a nitrogen ($N_2$) gas, a helium (He) gas, or an argon (Ar) gas; or an oxygen ($O_2$) gas and the like) into the heat treatment space 65. The inlet passage 81 has one end connected through a valve 82 to a gas supply mechanism not shown and the other end connected to a gas inlet buffer 83 formed inside the chamber side portion 63. The transport opening 66 has an outlet passage 86 formed to exhaust a gas within the heat treatment space 65 and connected through a valve 87 to an exhaust mechanism not shown.

Figure 2:
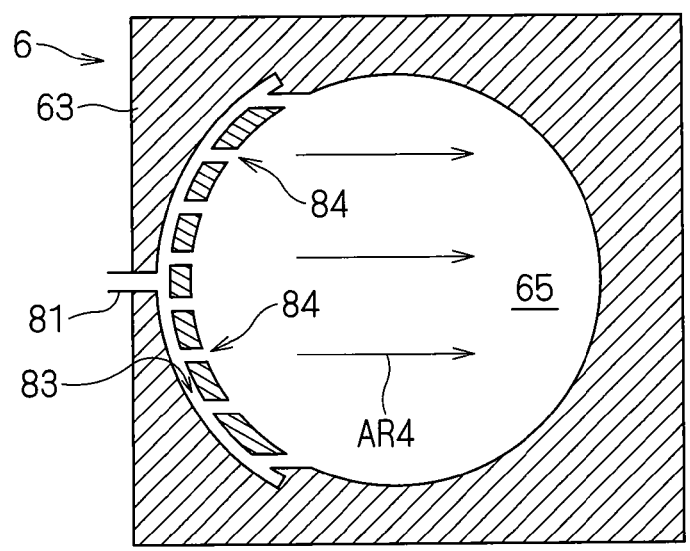
FIG. 2 is a cross-sectional view of a gas passage in the heat treatment apparatus in FIG. 1.

FIG. 2 is a cross-sectional view of the chamber 6 taken along a horizontal plane at the level of the gas inlet buffer 83. As illustrated in FIG. 2, the gas inlet buffer 83 is formed to extend over about one third of the inner periphery of the chamber side portion 63 on the opposite side from the transport opening 66 in FIG. 1, so that the processing gas introduced into the gas inlet buffer 83 through the inlet passage 81 is supplied through a plurality of gas supply holes 84 into the heat treatment space 65.

The heat treatment apparatus 1 further includes the generally disk-shaped holder 7 for holding a semiconductor wafer W in a horizontal position inside the chamber 6 and preheating the held semiconductor wafer W prior to photo-irradiation; and a holder elevating mechanism 4 for moving the holder 7 vertically relative to the chamber bottom portion 62, which is the bottom of the chamber 6. The holder elevating mechanism 4 in FIG. 1 includes a generally cylindrical shaft 41, a movable plate 42, guide members 43 (in the present preferred embodiment, three guide members 43 are located around the shaft 41), a fixed plate 44, a ball screw 45, a nut 46, and a motor 40. The chamber bottom portion 62, which is the bottom of the chamber 6, has a generally circular lower opening 64 that has a smaller diameter than the holder 7. The shaft 41 of stainless steel extends through the lower opening 64 and is connected to the underside of the holder 7 (in this preferred embodiment, a hot plate 71 of the holder 7) to support the holder 7.

The nut 46 in threaded engagement with the ball screw 45 is fixed to the movable plate 42. The movable plate 42 is movable in a vertical direction by being slidably guided by the guide members 43 that are fixed to and extend downwardly from the chamber bottom portion 62. The movable plate 42 is coupled to the holder 7 through the shaft 41.

The motor 40 is installed on the fixed plate 44 mounted to the lower ends of the guide members 43 and is connected to the ball screw 45 via a timing belt 401. When the holder elevating mechanism 4 moves the holder 7 vertically, the motor 40 serving as a driver rotates the ball screw 45 under the control of the controller 3 so that the movable plate 42 fixed to the nut 46 is moved along the guide members 43 in a vertical direction. The result is that the shaft 41 fixed to the movable plate 42 is moved in a vertical direction so that the holder 7 connected to the shaft 41 is moved up and down smoothly between a transfer position for transfer of a semiconductor wafer W in FIG. 1 and a processing position for processing of the semiconductor wafer W in FIG. 5.

On the upper surface of the movable plate 42, a mechanical stopper 451 of a generally semi-cylindrical shape (the shape formed by cutting a cylinder into half along its length) extends upright along the ball screw 45. Even if any anomalies happen to cause the movable plate 42 to move up above a given upper limit, the top end of the mechanical stopper 451 will strike an end plate 452 provided at the end of the ball screw 45, preventing irregular upward movement of the movable plate 42. This prevents the holder 7 from being moved up above a given level under the chamber window 61, thus avoiding collision of the holder 7 with the chamber window 61.

The holder elevating mechanism 4 further includes a manual elevator 49 for manually moving the holder 7 up and down for maintenance of the interior of the chamber 6. The manual elevator 49 includes a handle 491 and a rotary shaft 492 and can move the holder 7 up and down by rotating the rotary shaft 492 with the handle 491 to thereby rotate the ball screw 45 connected to the rotary shaft 492 via a timing belt 495.

On the underside of the chamber bottom portion 62, expandable and contractible bellows 47 that extend downwardly around the shaft 41 are provided, with their upper ends connected to the underside of the chamber bottom portion 62. The lower ends of the bellows 47 are mounted to a bellows-lower-end plate 471. The bellows-lower-end plate 471 is screwed to the shaft 41 with a collar member 411. The bellows 47 will contract when the holder elevating mechanism 4 moves the holder 7 upwardly relative to the chamber bottom portion 62, while they will expand when the holder elevating mechanism 4 moves the holder 7 downwardly. The expansion and contraction of the bellows 47 allows the heat treatment space 65 to be kept air-tight even during the upward and downward movement of the holder 7.

Figure 3:
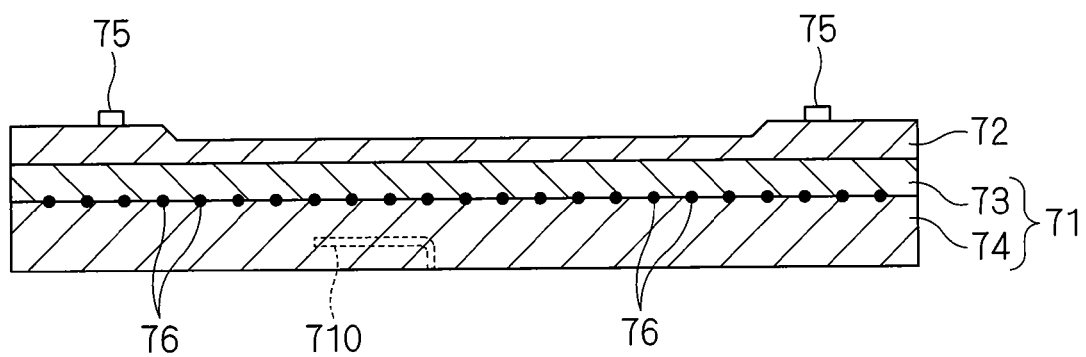
FIG. 3 is a cross-sectional view illustrating a structure of a holder.

FIG. 3 is a cross-sectional view of the structure of the holder 7. The holder 7 includes the hot plate (heating plate) 71 for preheating (what is called assisted heating) a semiconductor wafer W; and a susceptor 72 installed on the upper surface (the face where the holder 7 holds a semiconductor wafer W) of the hot plate 71. The underside of the holder 7 is, as described previously, connected to the shaft 41 for moving the holder 7 up and down. The susceptor 72 is made of quartz (or it may be of aluminum nitride (AlN) and the like) and has, on the upper surface, pins 75 for preventing misalignment of a semiconductor wafer W. The susceptor 72 is provided on the hot plate 71, with its underside in face-to-face contact with the upper surface of the hot plate 71. The susceptor 72 is thus capable of diffusing and transmitting heat energy from the hot plate 71 to a semiconductor wafer W placed on its upper surface and is cleanable during maintenance by being removed from the hot plate 71.

The hot plate 71 includes an upper plate 73 and a lower plate 74, both made of stainless steel. Resistance heating wires 76, such as nichrome wires, for heating the hot plate 71 are installed between the upper and lower plates 73 and 74, and a space between the upper and lower plates 73 and 74 is filled and sealed with electrically conductive brazing nickel (Ni). The upper and lower plates 73 and 74 are brazed to each other at their ends.

FIG. 4 is a plan view of the hot plate 71. As illustrated in FIG. 4, the hot plate 71 has a disk-shaped zone 711 and a ring-shaped zone 712 that are concentrically arranged in the central portion of an area facing a semiconductor wafer W being held; and four zones 713 to 716 formed by dividing a generally ring-shaped area around the zone 712 into four equal sections in a circumferential direction. Each pair of adjacent zones has a slight gap formed therebetween. The hot plate 71 is further provided with three through holes 77 through which the support pins 70 are inserted and which are spaced apart from one another on the circumference of a gap between the zones 711 and 712.

In each of the six zones 711 to 716, the resistance heating wires 76 are installed independent of one another to circulate around each zone to form an individual heater, so that each zone is heated individually by its own built-in heater. A semiconductor wafer W held by the holder 7 is heated by those built-in heaters in the six zones 711 to 716. Each of the zones 711 to 716 has a sensor 710 for measuring the temperature of each zone with a thermocouple. Each sensor 710 is connected to the controller 3 through the inside of the generally cylindrical shaft 41.

In heating the hot plate 71, the controller 3 controls the amount of power supplied to the resistance heating wires 76 installed in each zone so that the temperature of each of the six zones 711 to 716 measured by the sensor 710 becomes a given preset temperature. The controller 3 uses PID (proportional integral derivative) control for the temperature control of each zone. In the hot plate 71, the temperature of each of the zones 711 to 716 is continuously measured until the heat treatment of a semiconductor wafer W is completed (or, when there are a plurality of semiconductor wafers W to be processed in succession, until the heat treatment of all the semiconductor wafers W is completed), and the amount of power supplied to the resistance heating wires 76 installed in each zone is controlled on an individual basis, i.e., the temperature of the heater built in each zone is controlled individually, so that the temperature of each zone is kept at a set temperature. The set temperature of each zone can be changed by only an individually determined offset value from a reference temperature.

The resistance heating wires 76 installed in each of the six zones 711 to 716 are connected to a power supply source (not shown) over a power line passing through the inside of the shaft 41. On the way from the power supply source to each zone, the power line from the power supply source is installed within a stainless tube filled with an insulator such as magnesia (magnesium oxide) so as to be electrically insulated from the other lines. The inside of the shaft 41 is open to the atmosphere.

The lamp house 5 includes, inside a casing 51, a light source including a plurality of (in this preferred embodiment, 30) xenon flash lamps FL, and a reflector 52 provided to cover over the light source. The lamp house 5 also has a lamp-light radiating window 53 mounted to the bottom of the casing 51. The lamp-light radiating window 53 forming the floor portion of the lamp house 5 is a plate-like member made of quartz. The lamp house 5 is provided above the chamber 6 so that the lamp-light radiating window 53 is opposed to the chamber window 61. The lamp house 5 applies light from the flash lamps FL through the lamp-light radiating window 53 and the chamber window 61 to a semiconductor wafer W held by the holder 7 within the chamber 6, to thereby heat the semiconductor wafer W.

The plurality of flash lamps FL, each of which is a rod-shaped lamp having an elongated cylindrical shape, are arranged in a plane so that they are longitudinally parallel to one another along the major surface (i.e., in the horizontal direction) of a semiconductor wafer W held by the holder 7. The plane defined by the arrangement of the flash lamps FL is accordingly a horizontal plane.

Figure 6:
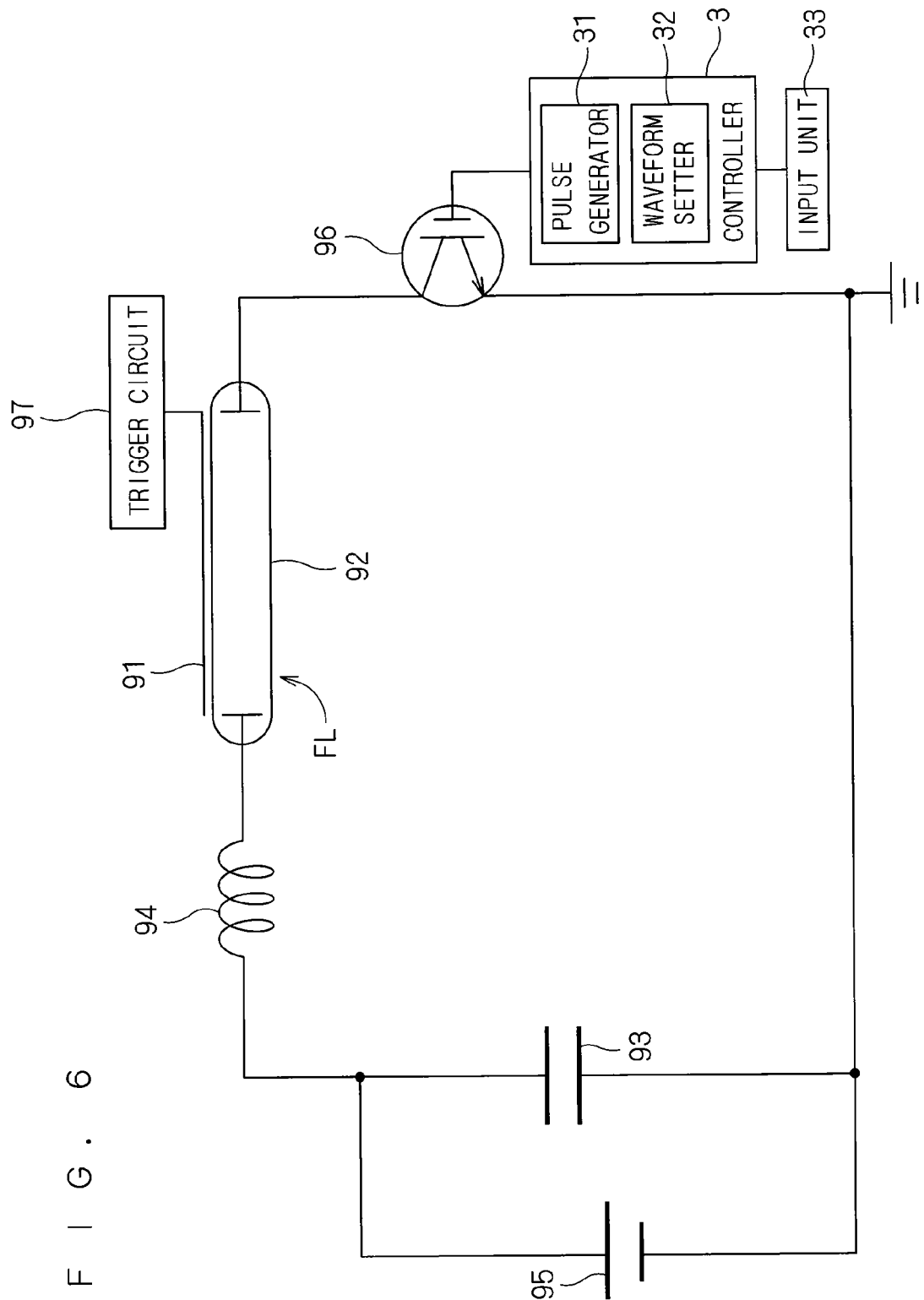
FIG. 6 illustrates a driving circuit for a flash lamp.

FIG. 6 illustrates a driving circuit for a flash lamp FL. As illustrated, a capacitor 93, a coil 94, a flash lamp FL, and a switching element 96 are connected in series. The flash lamp FL includes a rod-shaped glass tube (discharge tube) 92 containing a xenon gas sealed therein and having positive and negative electrodes provided on its opposite ends; and a trigger electrode 91 wound on the outer peripheral surface of the glass tube 92. Upon the application of a given voltage from a power supply unit 95, the capacitor 93 is charged in response to the applied voltage. A trigger circuit 97 is capable of applying voltage to the trigger electrode 91. The timing of the voltage application from the trigger circuit 97 to the trigger electrode 91 is under the control of the controller 3.

The present preferred embodiment employs an insulated gate bipolar transistor (IGBT) as the switching element 96. The IGBT is a bipolar transistor that incorporates a MOSFET (metal-oxide-semiconductor field-effect transistor) into the gate and is also a switching element suitable for handling a large amount of power. The switching element 96 receives, at its gate, a pulse signal from a pulse generator 31 in the controller 3.

Even if, with the capacitor 93 in the charged state, a pulse is output to the gate of the switching element 96 and a high voltage is applied to the electrodes across the glass tube 92, no electricity will flow through the glass tube 92 in a normal state because the xenon gas is electrically insulative. However, if the application of voltage from the trigger circuit 97 to the trigger electrode 91 produces an electrical breakdown, discharge occurring across the electrodes causes a current to flow instantaneously into the glass tube 92, and the resultant excitation of xenon atoms or molecules induces light emission.

The reflector 52 in FIG. 1 is provided above the plurality of flash lamps FL to cover over all those flash lamps FL. A fundamental function of the reflector 52 is to reflect the light emitted from the plurality of flash lamps FL toward the holder 7. The reflector 52 is an aluminum alloy plate, and its surface (facing the flash lamps FL) is roughened by abrasive blasting to produce a satin finish thereon. Such surface roughing is required, because if the reflector 52 has a perfect mirror surface, the intensity of the reflected light from the plurality of flash lamps FL will exhibit a regular pattern, which can cause deterioration in the uniformity of the surface temperature distribution in the semiconductor wafer W.

The controller 3 controls the aforementioned various operating mechanisms provided in the heat treatment apparatus 1. The hardware configuration of the controller 3 is similar to that of a general computer. Specifically, the controller 3 includes a CPU for performing various computations; a ROM or read-only memory for storing basic programs therein; a RAM or readable/writable memory for storing various pieces of information therein; and a magnetic disk for storing control software, data, etc. therein. The controller 3 further includes the pulse generator 31 and a waveform setter 32 and is connected to an input unit 33. The input unit 33 may be any of various known input equipment such as a keyboard, a mouse, or a touch panel. The waveform setter 32 sets the waveform of a pulse signal based on the input contents from the input unit 33, and the pulse generator 31 generates a pulse signal in accordance with that waveform.

The heat treatment apparatus 1 further includes, in addition to the above components, various cooling structures to prevent an excessive temperature rise in the chamber 6 and in the lamp house 5 due to heat energy generated by the flash lamps FL and the hot plate 71 during the heat treatment of a semiconductor wafer W. For instance, a water cooling tube (not shown) is provided in the chamber side portion 63 and the chamber bottom portion 62 of the chamber 6. The lamp house 5 forms an air cooling structure in which a gas supply pipe 55 and an exhaust pipe 56 are provided to form a gas flow therein and to exhaust heat (cf. FIGS. 1 and 5). Air is also supplied to a gap between the chamber window 61 and the lamp-light radiating window 53 to cool the lamp house 5 and the chamber window 61.

Figure 7:
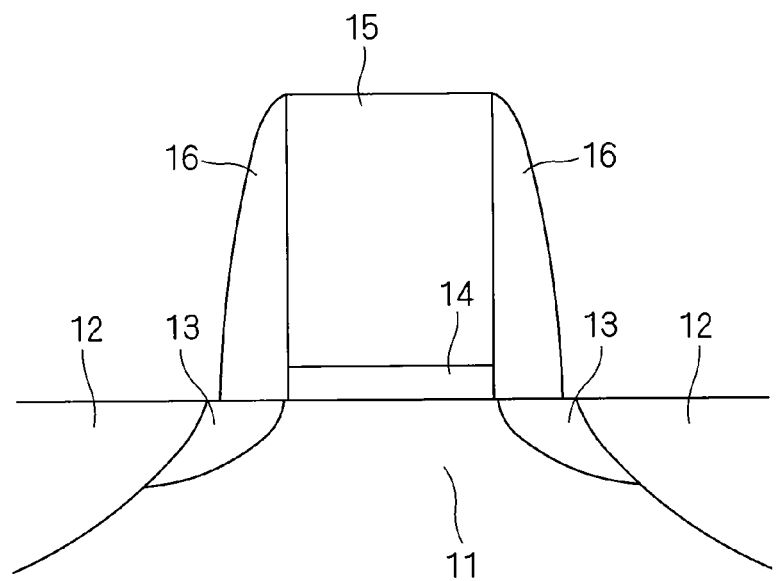
FIG. 7 illustrates the structure of elements formed in or on a semiconductor wafer that is to be processed by the heat treatment apparatus in FIG. 1.

Next, a procedure for processing a semiconductor wafer W in the heat treatment apparatus 1 is described. A semiconductor wafer W to be processed herein is a semiconductor substrate that has been doped with impurities (ions) by ion implantation. FIG. 7 illustrates the structure of elements formed on a semiconductor wafer W to be processed by the heat treatment apparatus 1 A source/drain region 12 and an extension region 13 are formed in a silicon substrate 11 and a gate electrode 15 is formed on the upper surface of the silicon substrate 11. The extension region 13 is an electrical connection between the source/drain region 12 and a channel. The gate electrode 15 made of metal is provided on the silicon substrate 11 with a gate insulating film 14 provided therebetween and has a sidewall 16 of ceramic formed on the side face. Impurities have been introduced into the source/drain region 12 and the extension region 13 by ion implantation; the activation of those impurities are induced by photo-irradiation heat treatment (annealing) performed by the heat treatment apparatus 1. The procedure performed by the heat treatment apparatus 1, which will be described below, proceeds under the control of the controller 3 that controls each operating mechanism of the heat treatment apparatus 1.

Figure 5:
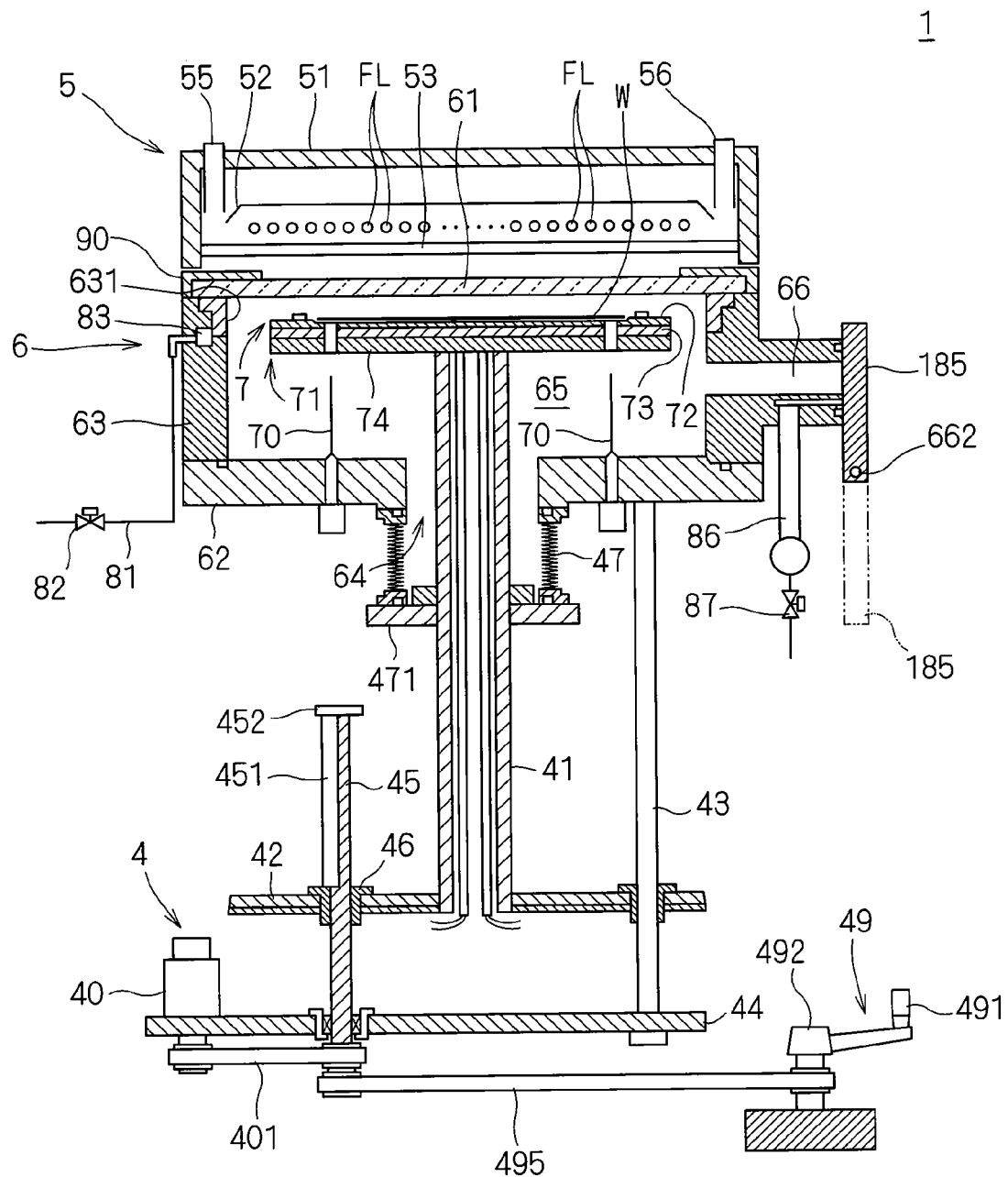
FIG. 5 illustrates a longitudinal section of the configuration of the heat treatment apparatus in FIG. 1.

First, the holder 7 is moved down from the processing position in FIG. 5 to the transfer position in FIG. 1. The "processing position" as used herein refers to the position of the holder 7 where light is applied from the flash lamps FL to the semiconductor wafer W, i.e., the position of the holder 7 within the chamber 6 shown in FIG. 5. The "transfer position" as used herein refers to the position of the holder 7 where the semiconductor wafer W is transported into and out of the chamber 6, i.e., the position of the holder 7 within the chamber 6 shown in FIG. 1. A reference position of the holder 7 in the heat treatment apparatus 1 is the processing position. Prior to processing, the holder 7 is in the processing position and, upon the start of processing, the holder 7 is moved down to the transfer position. When moved down to the transfer position as illustrated in FIG. 1, the holder 7 is brought into close proximity to the chamber bottom portion 62, so that the upper ends of the support pins 70 protrude through the holder 7 above the holder 7.

When the holder 7 is moved down to the transfer position, the valves 82 and 87 are opened to introduce a room-temperature nitrogen gas into the heat treatment space 65 of the chamber 6. Then, the gate valve 185 is opened to open the transport opening 66, whereby a semiconductor wafer W is transported through the transport opening 66 into the chamber 6 and placed on the plurality of support pins 70 by a transport robot outside the apparatus.

The nitrogen gas supplied into the chamber 6 during the transport of the semiconductor wafer W is purged from the chamber 6 at a rate of about 40 L/min. The supplied nitrogen gas will flow from the gas inlet buffer 83 in the direction of the arrows AR4 in FIG. 2 within the chamber 6 and will be exhausted through the outlet passage 86 and the valve 87 in FIG. 1, using a utility exhaust system. Part of the nitrogen gas supplied into the chamber 6 is also exhausted from an exhaust port (not shown) provided inside the bellows 47. In each step described below, the nitrogen gas is continuously supplied into and exhausted from the chamber 6, and the amount of nitrogen gas supplied may vary widely in accordance with each step for processing the semiconductor wafer W.

After the transport of the semiconductor wafer W into the chamber 6, the transport opening 66 is closed with the gate valve 185. Then, the holder elevating mechanism 4 moves the holder 7 upwardly from the transfer position to the processing position, which is in close proximity to the chamber window 61. In the course of the upward movement of the holder 7 from the transfer position, the semiconductor wafer W is transferred from the support pins 70 to the susceptor 72 of the holder 7 and then placed and held on the upper surface of the susceptor 72. When the holder 7 is moved up to the processing position, the semiconductor wafer W held on the susceptor 72 is also held at the processing position.

Each of the six zones 711 to 716 of the hot plate 71 has been heated up to a given temperature by its own individually built-in heater (the resistance heating wires 76) in each zone (between the upper plate 73 and the lower plate 74). By the holder 7 being moved up to the processing position and brought into contact with the semiconductor wafer W, the semiconductor wafer W is preheated by the heaters built in the hot plate 71 and its temperature rises gradually.

Figure 8:
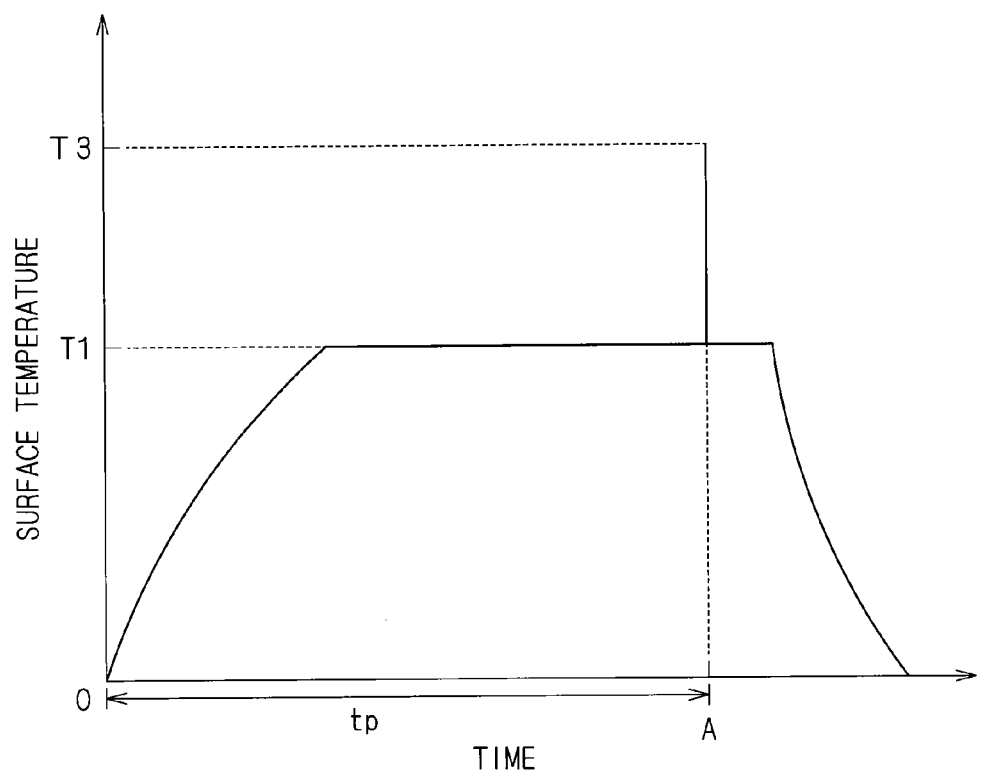
FIG. 8 shows changes in the surface temperature of a semiconductor wafer from the start of preheating.

FIG. 8 shows changes in the surface temperature of a semiconductor wafer W from the start of preheating. Preheating for time tp at the processing position causes the temperature of a semiconductor wafer W to rise up to a preset preheating temperature T1. The preheating temperature T1 is of the order of 200 to 800° C., preferably of the order of 350 to 600° C. (in the present preferred embodiment, 600° C.) at which temperature there is no apprehension that impurities used in doping the semiconductor wafer W are heat diffused. The time tp for preheating the semiconductor wafer W ranges from about 3 to about 200 seconds (in the present preferred embodiment, 60 seconds). The distance between the holder 7 and the chamber window 61 may be varied arbitrarily by controlling the amount of rotation of the motor 40 in the holder elevating mechanism 4.

After the lapse of the preheating time tp, photo-irradiation heating of the semiconductor wafer W is started using the flash lamps FL at time A. For photo-irradiation from the flash lamps FL, the capacitor 93 should be charged in advance by the power supply unit 95. Then, with the capacitor 93 in the charged state, a pulse signal is output from the pulse generator 31 in the controller 3 to the switching element 96.

Figure 9:
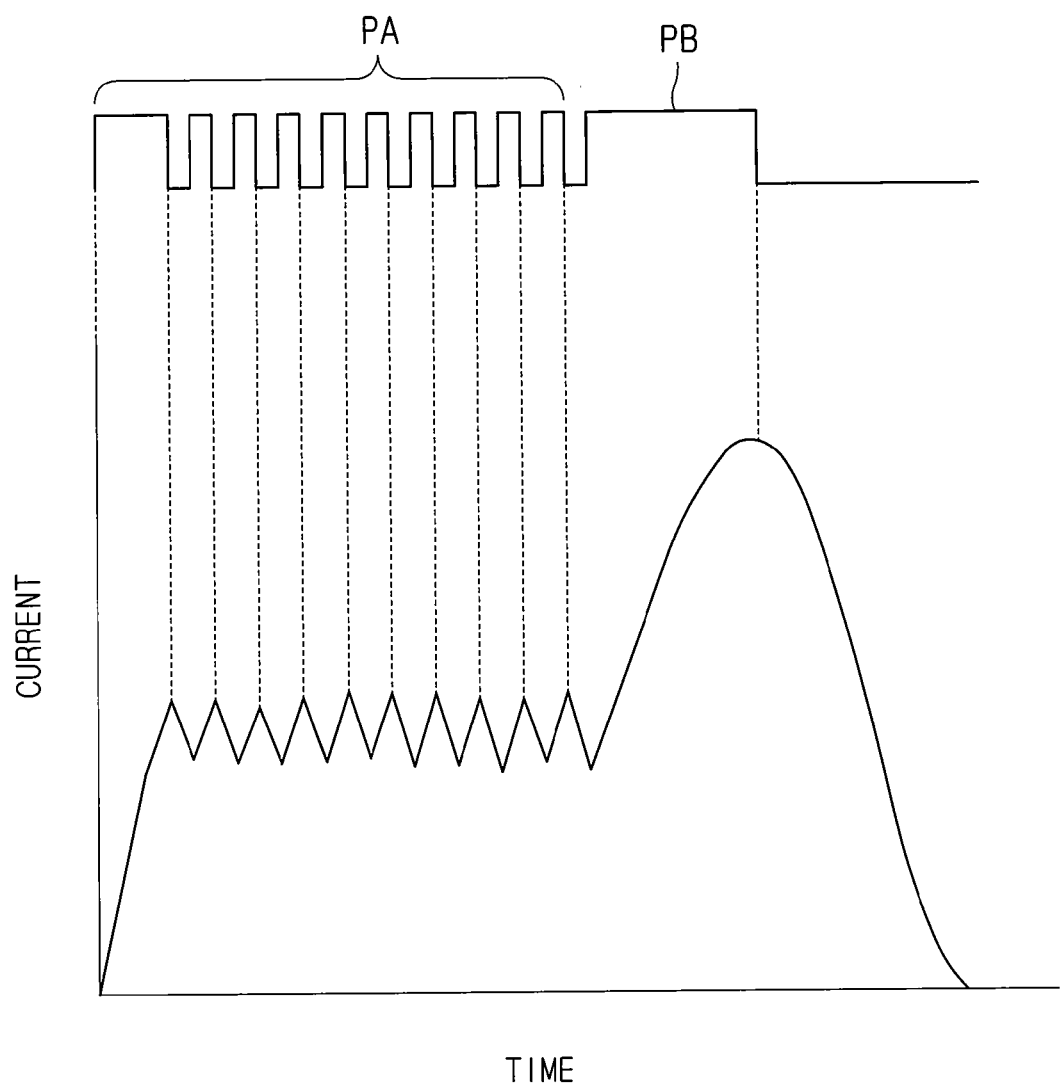
FIG. 9 shows an example of the correlation between a pulse signal waveform and a current flowing through a circuit.

FIG. 9 shows an example of the correlation between the waveform of a pulse signal and the current flowing through a circuit. In the present example, a pulse signal having a waveform as shown in the upper part of FIG. 9 is output from the pulse generator 31. The pulse signal waveform can be defined by inputting a set of instructions that sequentially define a period of time (ON time) equivalent to the pulse width and a period of time (OFF time) between each pulse, from the input unit 33. Upon operator input of such a set of instructions from the input unit 33 to the controller 3, the waveform setter 32 in the controller 3 sets a pulse waveform as shown in the upper part of FIG. 9. The pulse waveform illustrated in the upper part of FIG. 9 is set to include a plurality of relatively short pulses PA in the earlier section and a subsequent single relatively long pulse PB in the later section. The pulse generator 31 then outputs a pulse signal in accordance with the pulse waveform that has been set by the waveform setter 32. As a result, a pulse signal having a waveform as shown in the upper part of FIG. 9 is applied to the gate of the switching element 96 so as to control the on/off driving of the switching element 96.

In synchronization with the timing of the turning on of the pulse signal output from the pulse generator 31, the controller 3 causes the trigger circuit 97 to apply a voltage to the trigger electrode 91. Thus, when the pulse signal that has been input to the gate of the switching element 96 is ON, a current inevitably flows between the electrodes across the glass tube 92, and the resultant excitation of xenon atoms or molecules induces light emission. The controller 3 outputs a pulse signal having a waveform as shown in the upper part of FIG. 9 to the gate of the switching element 96 and a voltage is applied to the trigger electrode 91 in synchronization with the timing of the turning on of the pulse signal, which produces a flow of current having a waveform as shown in the lower part of FIG. 9 in the circuit including the flash lamp FL. In other words, the value of the current flowing through the glass tube 92 of the flash lamp FL increases when the pulse signal that has been input into the gate of the switching element 96 is ON, and the current value decreases when the pulse signal is OFF. Note that an individual current waveform corresponding to each pulse is defined by the constant of the coil 94.

The flow of a current having a waveform as shown in the lower part of FIG. 9 causes light emission from a flash lamp FL. The light-emission output of a flash lamp FL is almost proportional to the current flowing through the flash lamp FL. Thus, the output waveform (profile) of the light-emission output of the flash lamp FL exhibits a pattern as shown in the upper part of FIG. 10. The photo-irradiation of a semiconductor wafer W held at the processing position by the holder 7 is performed in accordance with the output waveform of the flash lamps FL as shown in the upper part of FIG. 10. As a result, the surface temperature of the semiconductor wafer W changes as shown in the lower part of FIG. 10.

If, as in conventional cases, a flash lamp FL emits light without using the switching element 96, the charge stored in the capacitor 93 is consumed by only one instance of light emission, so that the flash lamp FL will produce a single-pulse output waveform having a width of approximately 0.1 to 10 milliseconds. On the other hand, if, as in the present preferred embodiment, the switching element 96 is connected in the circuit and a pulse signal as shown in the upper part of FIG. 9 is output to the gate of the switching element 96, the light emission from the flash lamp FL can be chopper-controlled, which allows the charge stored in the capacitor 93 to be divided for consumption, enabling the flash lamp FL to repeatedly flash within an extremely short period of time. Note that, as shown in FIG. 9, the light-emission output never becomes exactly zero even while the flash lamp FL repeatedly flashes, because before the current value becomes exactly zero, the next pulse is applied to the gate of the switching element 96 to again increase the current value.

Figure 10:
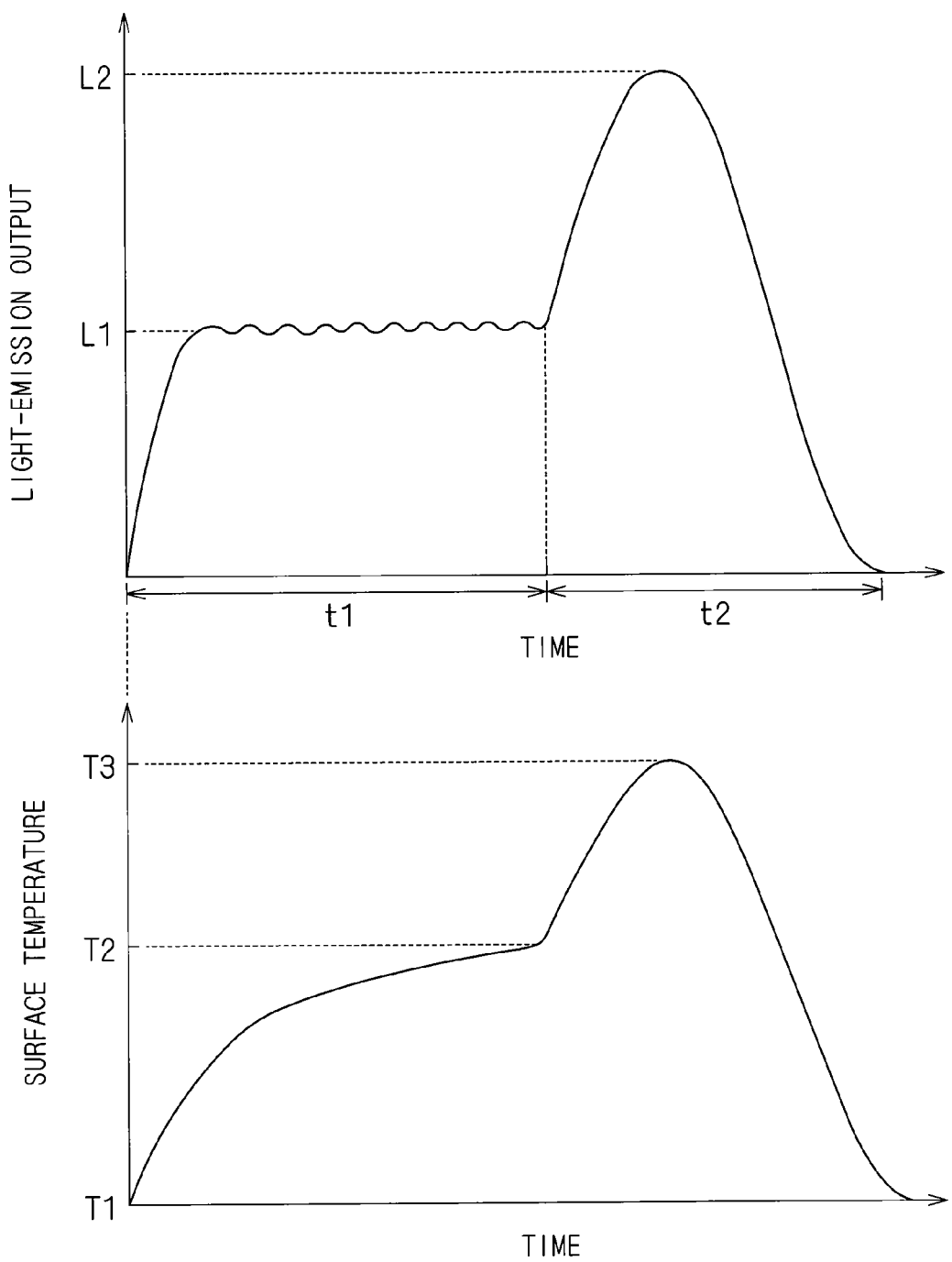
FIG. 10 shows an example of the correlation between the light-emission output of a flash lamp and the surface temperature of a semiconductor wafer.

The output waveform of light as shown in the upper part of FIG. 10 can be regarded as executing two-step photo-irradiation. Specifically, such two-step photo-irradiation includes a first step of performing photo-irradiation of a semiconductor wafer W in accordance with a relatively low and flat output waveform; and a second step of performing photo-irradiation of a semiconductor wafer W in accordance with a relatively high-peaked output waveform.

To be more specific, as a first step, the pulse generator 31 outputs a plurality of relatively short pulses PA to the gate of a switching element 96, which causes the switching element 96 to repeatedly turn on and off so that a current having a waveform as shown in the earlier section of the lower part of FIG. 9 flows through the circuit including the flash lamp FL. This results in the flash lamp FL emitting light in accordance with a generally flat output waveform with an average light-emission output L1 as shown in the earlier section of the upper part of FIG. 10, which is the first step of photo-irradiation of a semiconductor wafer W. A photo-irradiation time t1 in the first step is not less than five milliseconds (in the present preferred embodiment, ten milliseconds).

The pulse generator 31 then outputs a single relatively long pulse PB to the gate of the switching element 96, which causes the switching element 96 to be turned off after being held in a momentary ON state so that a current having a waveform that peaks as shown in the later section of the lower part of FIG. 9 flows through the circuit including the flash lamp FL. This results in the flash lamp FL emitting light in accordance with an output waveform that peaks at a light-emission output L2 that is higher than both the average light-emission output L1 in the first step and a maximum light-emission output in the first step as shown in the later section of the upper part of FIG. 10, which is the second step of photo-irradiation of a semiconductor wafer W. The peak light-emission output L2 in the second step of photo-irradiation is 1.5 times or more the average light-emission output L1 in the first step. A photo-irradiation time t2 in the second step is between 0.1 and 10 milliseconds (in the present preferred embodiment, three milliseconds). However, a total photo-irradiation time of the flash lamps FL for single flash heating, i.e., a total of the photo-irradiation time t1 in the first step and the photo-irradiation time t2 in the second step, is not more than one second.

As shown in the lower part of FIG. 10, the execution of the first step of photo-irradiation of a semiconductor wafer W in accordance with a flat output waveform with the average light-emission output L1 causes the surface temperature of the semiconductor wafer W to increase once from a preheating temperature T1 to a temperature T2. The surface temperature of the semiconductor wafer W is then increased from the temperature T2 to a processing temperature T3 by the subsequent execution of the photo-irradiation of the semiconductor wafer W in accordance with an output waveform that peaks at the light-emission output L2. The processing temperature T3 is a temperature at which impurities that have been implanted in a semiconductor wafer W are activated; in the first preferred embodiment, the processing temperature T3 is 1300° C. or higher.

After the completion of the second step of photo-irradiation, the surface temperature of the semiconductor wafer W drops rapidly from the processing temperature T3. Then, after completion of the two-step photo-irradiation heating with the flash lamps FL and after approximately a 10-second standby at the processing position, the holder elevating mechanism 4 moves the holder 7 again down to the transfer position in FIG. 1, at which position the semiconductor wafer W is transferred from the holder 7 to the support pins 70. Then, the transport opening 66, which had been closed by the gate valve 185, is opened so that the semiconductor wafer W placed on the support pins 70 is transported out by the transport robot outside the apparatus. This completes the photo-irradiation heat treatment of the semiconductor wafer W in the heat treatment apparatus 1.

As described previously, a nitrogen gas is continuously supplied into the chamber 6 during the heat treatment of the semiconductor wafer W in the heat treatment apparatus 1. The amount of that supply is approximately 30 liters per minute when the holder 7 is at the processing position, and approximately 40 liters per minute when the holder 7 is at any position other than the processing position.

In the case of conventional single-pulse irradiation with flashes of light, in order to increase the ultimate surface temperature of a semiconductor wafer W so as to reduce the sheet resistance value, it has been necessary to accumulate a larger amount of charge in the capacitor 93 so that the flash lamp FL can generate an exceedingly high light-emission output. This, as described previously, incurs the possibilities of not only shortening the lifetime of the flash lamp FL but also causing the semiconductor wafer W to shatter due to sudden thermal expansion occurring at the wafer surface.

In the first preferred embodiment, a two-step photo-irradiation heat treatment is performed, in which the first step of photo-irradiation of a semiconductor wafer W is performed with an emission output that averages out at the light-emission output L1, and then the second step of photo-irradiation of the semiconductor wafer W is performed in accordance with an output waveform that peaks at the light-emission output L2 that is higher than both the average light-emission output L1 in the first step and the maximum light-emission output in the first step. By in this way first performing the first step of photo-irradiation with the relatively low average light-emission output L1, the surface temperature of the semiconductor wafer W increases from the preheating temperature T1 to the temperature T2, which enables a certain level of thermal storage. The subsequent execution of the photo-irradiation of the semiconductor wafer W in accordance with an output waveform that peaks at the relatively high light-emission output L2 enables the ultimate surface temperature of the wafer to increase further with a smaller amount of total irradiation energy than in the case of conventional single-pulse irradiation with flashes of light. Consequently, a further reduction in the sheet resistance value is possible with a smaller amount of energy than in conventional cases. In other words, the first step of relatively weak photo-irradiation is a kind of preliminary photo-irradiation heating for the second step of intense photo-irradiation.

In the process of performing the first step of photo-irradiation, the temperature difference between the front and back surfaces of a semiconductor wafer W decreases because the heat on the front surface side of the semiconductor wafer W reaches the back surface side to some extent. When the second step of intense photo-irradiation is performed under this condition, the ultimate surface temperature of the semiconductor wafer W increases up to a high processing temperature T3 while preventing the wafer W from shattering.

In addition, performing photo-irradiation in two steps prevents the lifetimes of flash lamps FL, etc. from being shortened because the instantaneous loads of the flash lamps FL and their driving circuits are not excessive.

Figure 11A:
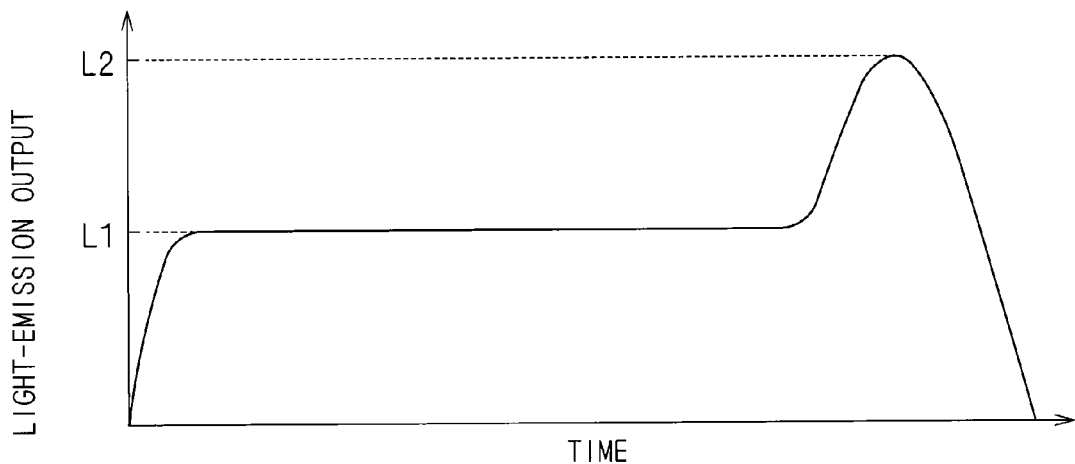
FIGS. 11A, 11B, and 11C show other examples of a profile of the light-emission output of a flash lamp.
Figure 11B:
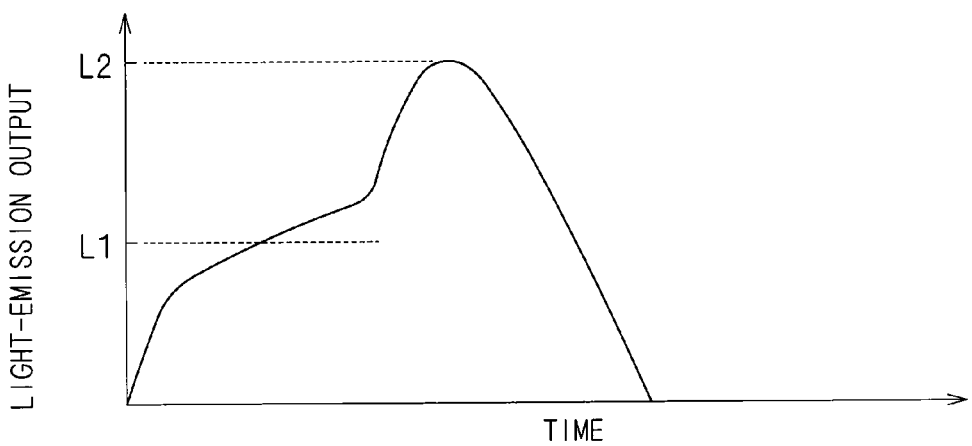
Figure 11C:
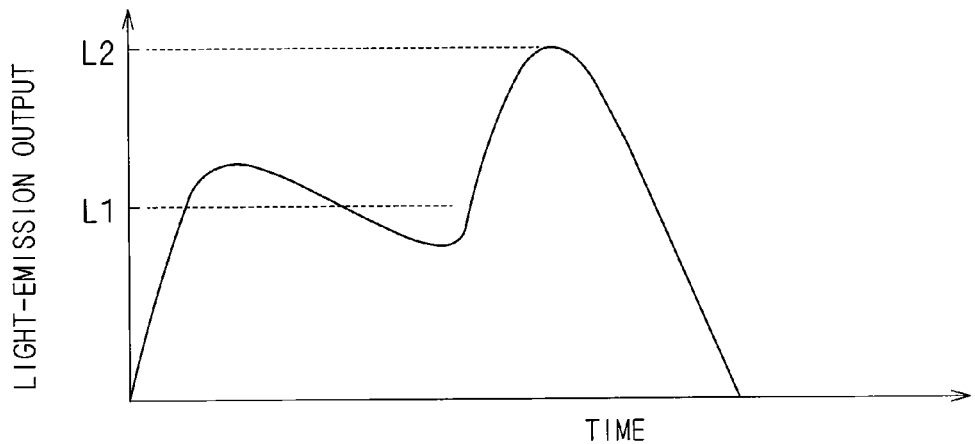

In the first preferred embodiment, the output waveform of the light-emission output of a flash lamp FL is not limited to the example shown in the upper part of FIG. 10; it may be any of those as shown in FIGS. 11A to 11C. In the example shown in FIG. 11A, a two-step photo-irradiation heat treatment is performed as well, in which the first step of photo-irradiation of a semiconductor wafer W is performed in accordance with a flat output waveform with an average light-emission output L1, and then the second step of photo-irradiation of the semiconductor wafer W is performed in accordance with an output waveform that peaks at a light-emission output L2 that is higher than both the average light-emission output L1 in the first step and a maximum light-emission output in the first step. The example in FIG. 11A differs from the example in the upper part of FIG. 10 in that the photo-irradiation time in the first step is longer than that in the example shown in the upper part of FIG. 10.

With the profile of the light-emission output of a flash lamp FL as shown in the example in FIG. 11A, the first step of relatively weak photo-irradiation is performed for a long time, which further reduces the temperature difference between the front and back surfaces of a semiconductor wafer W at the time of execution of the second step of intense photo-irradiation, thus further reducing the frequency of the semiconductor wafer W shattering. The photo-irradiation time in the first step may be even longer (e.g., several hundred milliseconds) than in the example in FIG. 11A, as long as it is not less than five milliseconds; however, the total of the photo-irradiation time in the first step and the photo-irradiation time in the second step is not more than one second.

In the example shown in FIG. 11B, the output waveform of the flash lamp FL in the first step is not flat but is inclined and shows an increase in the light-emission output with the lapse of time. On the other hand, in the example shown in FIG. 11C, the output waveform of the flash lamp FL in the first step is inclined and shows a decrease in the light-emission output with the lapse of time. However, in either example, the average value for the light-emission output in the first step is L1. Also, the peak light-emission output L2 in the second step is higher than the maximum light-emission output in the first step. Even in those examples, it is possible to increase the ultimate surface temperature of a semiconductor wafer W with a smaller amount of energy while preventing the wafer W from shattering, because the second step of intense photo-irradiation with a higher peak is performed after the execution of the first step of relatively weak photo-irradiation.

In summary, a semiconductor wafer W should be subjected first to the first step of photo-irradiation that is performed with a light-emission output that averages out at the light-emission output L1 and then to the second step of photo-irradiation that is performed in accordance with an output waveform that peaks at the light-emission output L2 that is higher than the average light-emission output L1 in the first step and the maximum light-emission output in the first step. Such a two-step photo-irradiation heat treatment enables a further increase in the surface temperature of a semiconductor wafer W while preventing the wafer W from shattering.

Second Preferred Embodiment

Figure 12:
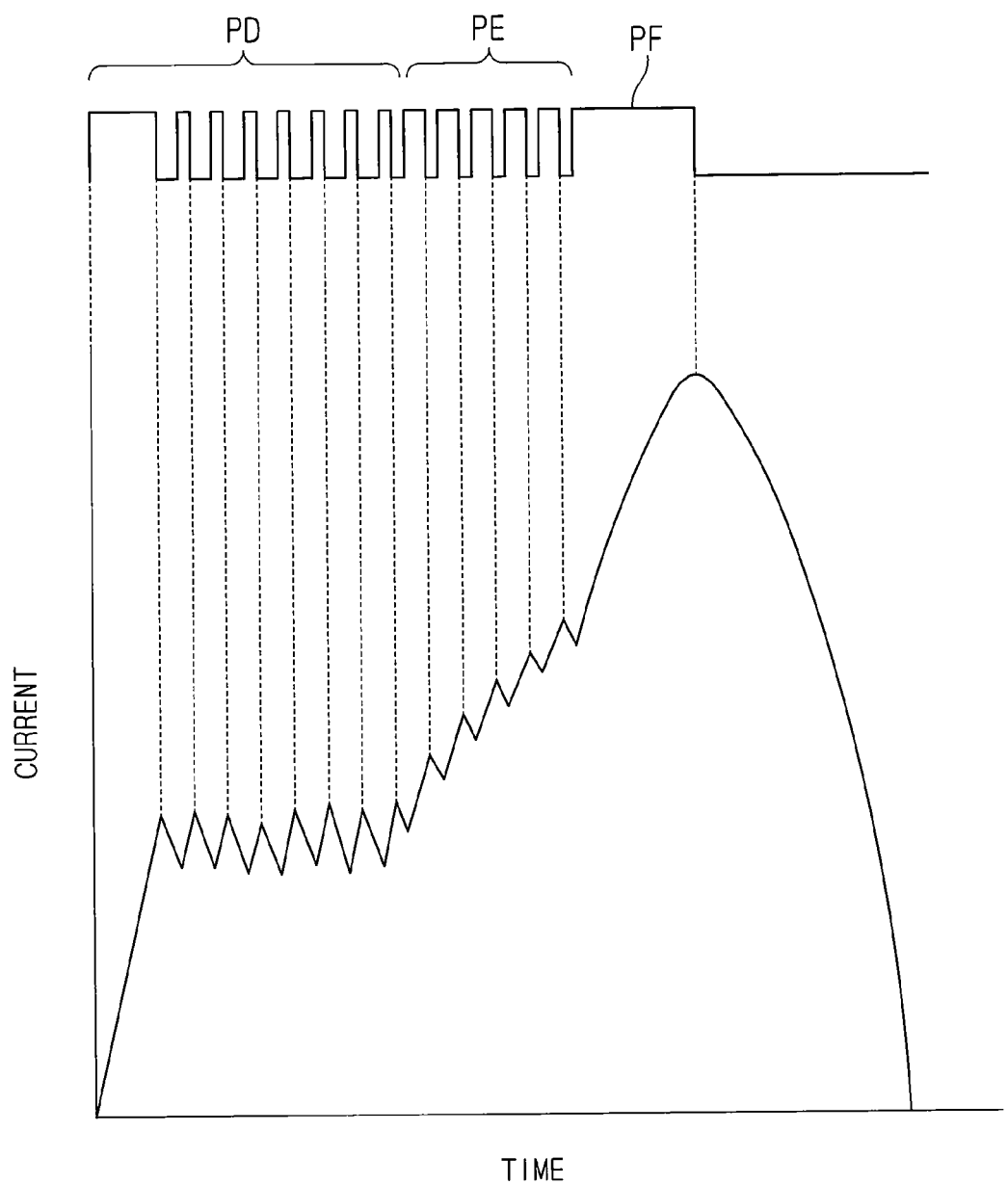
FIG. 12 shows another example of the correlation between a pulse signal waveform and a current flowing through a circuit.

Next, a second preferred embodiment of the present invention will be described. A heat treatment apparatus according to the second preferred embodiment is identical in configuration to that of the first preferred embodiment. The procedure for processing a semiconductor wafer W according to the second preferred embodiment is also generally the same as that in the first preferred embodiment. FIG. 12 shows another example of the correlation between a pulse signal waveform and a current flowing through a circuit. In the second preferred embodiment, the pulse generator 31 outputs a pulse signal having a waveform as shown in the upper part of FIG. 12. The pulse waveform shown in the upper part of FIG. 12 includes a plurality of relatively short pulses PD in the earlier section, then a plurality of pulses PE, and then a single relatively long pulse PF. In the second preferred embodiment, a pulse signal having a waveform as shown in the upper part of FIG. 12 is applied to the gate of the switching element 96 so as to control the on/off driving of the switching element 96.

In synchronization with the timing of the turning on of the pulse signal that has been output from the pulse generator 31, the controller 3 causes the trigger circuit 97 to apply a voltage to the trigger electrode 91. Thus, when the pulse signal that has been input to the gate of the switching element 96 is ON, a current inevitably flows between the electrodes across the glass tube 92, and the resultant excitation of xenon atoms or molecules induces light emission. The controller 3 outputs a pulse signal of a waveform as shown in the upper part of FIG. 12 to the gate of the switching element 96 and a voltage is applied to the trigger electrode 91 in synchronization with the timing of the turning on of the pulse signal, which produces a flow of current having a waveform as shown in the lower part of FIG. 12 in the circuit including the flash lamp FL. In other words, the value of the current flowing through the glass tube 92 of the flash lamp FL increases when the pulse signal that has been input to the gate of the switching element 96 is ON, and the current value decreases when the pulse signal is OFF. Note that an individual current waveform corresponding to each pulse is defined by the constant of the coil 94.

Figure 13:
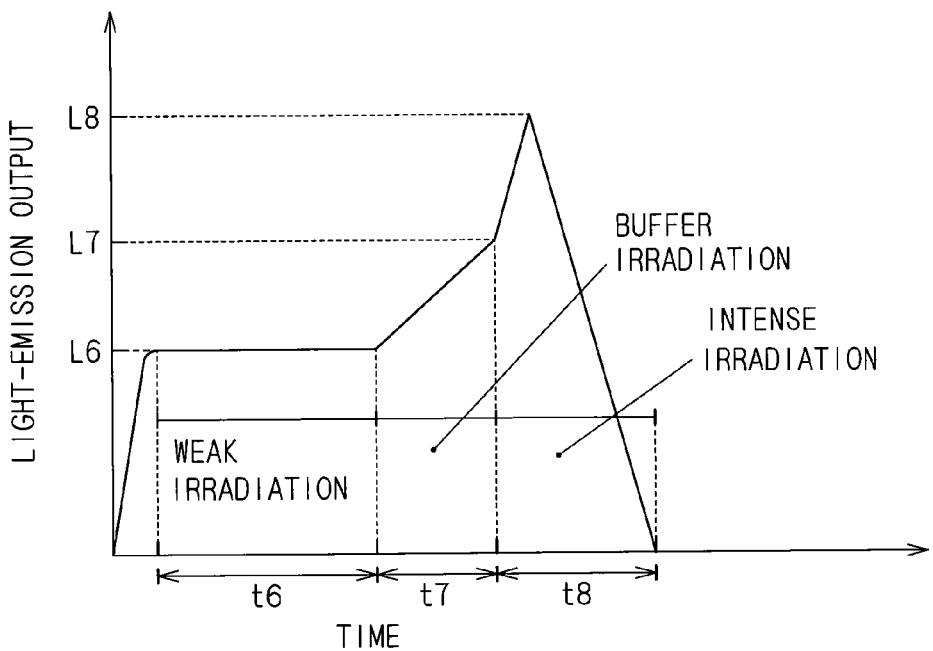
FIG. 13 shows another example of a profile of the light-emission output of a flash lamp.

The flow of current having a waveform as shown in the lower part of FIG. 12 causes light emission from a flash lamp FL. The light-emission output of a flash lamp FL is almost proportional to the current flowing through the flash lamp FL. Thus, the output waveform (profile) of the light-emission output of a flash lamp FL exhibits a pattern as shown in FIG. 13. The photo-irradiation of a semiconductor wafer W held at the processing position by the holder 7 is performed in accordance with the output waveform of the flash lamps FL as shown in FIG. 13.

The output waveform of light as shown in FIG. 13 can be regarded as executing three-step photo-irradiation. Specifically, such three-step photo-irradiation includes weak irradiation in which photo-irradiation of a semiconductor wafer W is performed in accordance with a relatively low and flat output waveform; intense irradiation in which photo-irradiation of the semiconductor wafer W is performed in accordance with a relatively high-peaked output waveform; and buffer irradiation in which photo-irradiation of the semiconductor wafer W is performed with an emission output that gradually increases from the light-emission output in the weak irradiation to the light-emission output in the intense photo-irradiation.

To be more specific, as a first step, the pulse generator 31 outputs a relatively long pulse (the leading pulse out of the plurality of pulses PD) to the gate of a switching element 96, which causes the switching element 96 to be held in the ON state so that the current that flows through the circuit including the flash lamp FL, i.e., the light-emission output of the flash lamp FL, increases up to L6. The pulse generator 31 then intermittently outputs a plurality of pulses PD to the gate of the switching element 96, which causes the switching element 96 to repeatedly turn on and off so that a current having a sawtooth waveform with an almost constant average value flows through the circuit including the flash lamp FL. This results in the flash lamp FL emitting light in accordance with a generally flat output waveform that averages out at the light-emission output L6, as shown in FIG. 13 as the weak irradiation.

The light-emission output in the weak irradiation step averages out at the light-emission output L6 and falls within a fluctuation range of plus or minus 30% from the average light-emission output L6. Further, a photo-irradiation time t6 in the weak irradiation step is between 5 and 100 milliseconds. In this way, the weak irradiation step is a step of performing photo-irradiation of a semiconductor wafer W with a light-emission output that averages out at the light-emission output L6 and that is kept for 5 to 100 milliseconds within a fluctuation range of plus or minus 30% from the light-emission output L6.

The pulse generator 31 then intermittently outputs a plurality of pulses PE to the gate of the switching element 96. The ON period of each of the plurality of pulses PE is longer than that of each of the plurality of pulses PD (except for the leading pulse), and the OFF time of each pulse PE is shorter than that of each pulse PD. This causes the switching element 96 to repeatedly turn on and off so that a current having a sawtooth waveform flows through the current including the flash lamp FL. The sawtooth pulses in this step tend to increase with time as a whole. As a result, the light-emission output of the flash lamp FL gradually increases from L6 to L7, as shown in FIG. 13 as the buffer irradiation. Note that the light-emission output L7 is higher than the light-emission output L6.

The light-emission output in the buffer irradiation step gradually increases from the average light-emission output L6 in the weak irradiation step to the light-emission output L7. A photo-irradiation time t7 in the buffer irradiation step is between 5 and 50 milliseconds. As described, the buffer irradiation step is a step, subsequent to the weak irradiation step, of performing photo-irradiation of a semiconductor wafer W with an emission output that increases from L6 to L7 over a time in the range of 5 to 50 milliseconds.

The pulse generator 31 then outputs a single relatively long pulse PF to the gate of the switching element 96, which causes the switching element 96 to be turned off after being held in a momentary ON state so that a current having a waveform that peaks as shown in the later section of the lower part of FIG. 12 flows through the circuit including the flash lamp FL. This results in the flash lamp FL emitting light in accordance with an output waveform that peaks at a light-emission output L8 that is higher than the light-emission outputs L6 and L7 as shown in FIG. 13 as the intense irradiation, which is the last step of photo-irradiation of the semiconductor wafer W.

A photo-irradiation time t8 in the intense irradiation step is between 1 and 5 milliseconds. As described, the intense irradiation step is a step, subsequent to the buffer irradiation step, of performing photo-irradiation of a semiconductor wafer W in accordance with an output waveform that peaks at the light-emission output L8 that is higher than the light-emission output L7 and whose irradiation time is between 1 and 5 milliseconds. Note that the total photo-irradiation time of the flash lamp FL for single flash heating, i.e., the total of the photo-irradiation time t6 in the weak irradiation step, the photo-irradiation time t7 in the buffer irradiation step, and the photo-irradiation time t8 in the intense irradiation step, is not more than one second. In addition, the rate of increase of the light-emission output in the buffer irradiation step (the inclination from the light-emission output L6 to the light-emission output L7 in FIG. 13) is between 10 and 40% of the rate of increase of the light-emission output until the light-emission output reaches a peak in the intense irradiation step (the inclination from the light-emission output L7 to the light-emission output L8).

The execution of the three-step photo-irradiation as shown in FIG. 13 causes the surface temperature of the semiconductor wafer W to increase from the preheating temperature T1 to the processing temperature T3 (cf. FIG. 8). More specifically, in the initial weak irradiation, the photo-irradiation of a semiconductor wafer W is performed with a light-emission output that averages out at the light-emission output L6 and that is kept for 5 to 100 milliseconds within a fluctuation range of plus or minus 30% from the light-emission output L6, which preheats the semiconductor wafer W so that the surface temperature of the wafer W increases to some extent from the preheating temperature T1.

Then in the subsequent buffer irradiation, the photo-irradiation of the semiconductor wafer W is performed with a light-emission output that increases from L6 to L7 over a time in the range of 5 to 50 milliseconds, which causes the surface temperature of the semiconductor wafer W to increase further. Then in the subsequent intense irradiation, the photo-irradiation of the semiconductor wafer W is performed in accordance with an output waveform that peaks at the light-emission output L8, which causes the surface temperature of the semiconductor wafer W to increase up to the ultimate processing temperature T3. This allows the activation of impurities implanted in the source/drain region 12 and the extension region 13 of the semiconductor wafer W. Note that in second preferred embodiment, the processing temperature T3 is 1000° C. or higher.

After completion of the intense irradiation step, the surface temperature of the semiconductor wafer W drops rapidly from the processing temperature T3. Then, after completion of the three-step photo-irradiation heating with the flash lamps FL and after approximately a 10-second standby at the processing position, the holder elevating mechanism 4 moves the holder 7 down again to the transfer position in FIG. 1, at which position the semiconductor wafer W is transferred from the holder 7 to the support pins 70. Subsequently, the transport opening 66, which had been closed by the gate valve 185, is opened, so that the semiconductor wafer W placed on the support pins 70 is transported out by the transport robot outside the apparatus. This completes the photo-irradiation heat treatment of the semiconductor wafer W in the heat treatment apparatus 1.

In the second preferred embodiment, weak irradiation is first performed for 5 to 100 milliseconds with an almost constant light-emission output L6, then buffer irradiation is performed which increases the light-emission output from L6 to L7 over a time in the range of 5 to 50 milliseconds, and then intense irradiation of the semiconductor wafer W is performed in accordance with an output waveform that peaks at a light-emission output L8 that is higher than the light-emission output L7. Since intense irradiation is performed in accordance with a waveform having a peak, on a semiconductor wafer W that has been preheated to some extent by weak irradiation, the surface temperature of the semiconductor wafer W can be further increased, which enables efficient activation of implanted impurities and thus allows an effective reduction in the sheet resistance value.

In addition, in the second preferred embodiment, the buffer irradiation step in which the light-emission output gradually increases from L6 to L7 over a time in the range of 5 to 50 milliseconds is performed between the weak irradiation step and the intense irradiation step. The execution of such buffer irradiation reduces the range of an instantaneous increase in the surface temperature of a semiconductor wafer W at the time of the intense irradiation, as compared with the case where there is a direct transition between the weak irradiation step and the intense irradiation step. This results in a reduction in the warping of a semiconductor wafer W in the intense irradiation step, thus reducing damage to the semiconductor wafer W and preventing the wafer W from shattering. In other words, the photo-irradiation heat treatment according to the second preferred embodiment enables the surface temperature of a semiconductor wafer W to increase further so as to reduce the sheet resistance value while preventing the semiconductor wafer W from shattering. Moreover, performing photo-irradiation in three steps prevents the lifetimes of flash lamps FL, etc. from being shortened because the instantaneous loads of the flash lamps FL and their driving circuits are not excessive.

Third Preferred Embodiment

Figure 14:
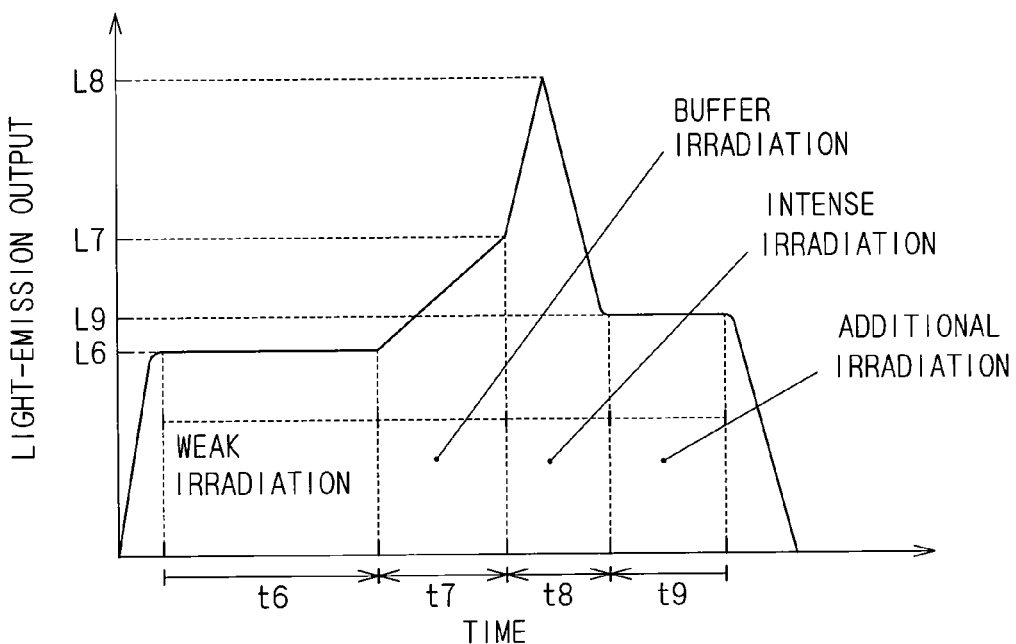
FIG. 14 shows another example of a profile of the light-emission output of a flash lamp.

Next, a third preferred embodiment of the present invention will be described. A heat treatment apparatus of the third preferred embodiment is identical in configuration to that of the first preferred embodiment. The procedure for processing a semiconductor wafer W according to the third preferred embodiment is also generally the same as that in the first preferred embodiment. The third preferred embodiment differs from the first preferred embodiment in the output waveform of the light-emission output of a flash lamp FL. FIG. 14 shows a profile of the light-emission output of a flash lamp FL according to the third preferred embodiment. The light-emission output of a flash lamp FL is almost proportional to the current flowing through the flash lamp FL, so that the profile of the light-emission output of a flash lamp FL can be controlled by controlling the waveform of a pulse signal that is output to the gate of the switching element 96.

The output waveform of light shown in FIG. 14 can be regarded as executing four-step photo-irradiation. Specifically, such four-step irradiation includes weak irradiation in which photo-irradiation of a semiconductor wafer W is performed in accordance with a relatively low and flat output waveform; intense irradiation in which photo-irradiation of the semiconductor wafer W is performed in accordance with a relatively high-peaked output waveform; buffer irradiation in which photo-irradiation of the semiconductor wafer W is performed with a light-emission output that gradually increases from the light-emission output in the weak irradiation to the light-emission output in the intense irradiation; and additional irradiation in which photo-irradiation of the semiconductor wafer W is again performed after the peak of the intense irradiation in accordance with a relatively low and flat output waveform.

From among the above four steps of photo-irradiation, the weak irradiation, the buffer irradiation, and the intense irradiation are identical to those described in the second preferred embodiment. That is, the weak irradiation is performed with a light-emission output that averages out at a light-emission output L6 and that is kept for 5 to 100 milliseconds within a fluctuation range of plus or minus 30% from the light-emission output L6, then the buffer irradiation is performed with a light-emission output that increases from L6 to L7 over a time in the range of 5 to 50 milliseconds, and then intense irradiation is performed in accordance with an output waveform that peaks at a light-emission output L8 that is higher than the light-emission output L7 and whose irradiation time is between 1 and 5 milliseconds.

In the third preferred embodiment, subsequent to the intense irradiation step, an additional irradiation step is performed as shown in FIG. 14 as additional irradiation, in which the flash lamps FL emit light in accordance with a generally flat output waveform with an average light-emission output L9. The light-emission output in the additional irradiation step averages out at a light-emission output L9 and falls within a fluctuation range of plus or minus 30% from the light-emission output L9. The light-emission output L9 in the additional irradiation step is lower than the peak light-emission output L8 in the intense irradiation step. Further, a photo-irradiation time t9 in the additional irradiation step is between 10 and 100 milliseconds. As described, the additional irradiation step is a step of performing photo-irradiation of a semiconductor wafer W with a light-emission output that averages out at a light-emission output L9 that is lower than the light-emission output L8 and that is kept for 10 to 100 milliseconds within a fluctuation range of plus or minus 30% from the light-emission output L9. Note that the total of the photo-irradiation time t6 in the weak irradiation step, the photo-irradiation time t7 in the buffer irradiation step, the photo-irradiation time t8 in the intense irradiation step, and the photo-irradiation time t9 in the additional irradiation step is not more than one second.

The execution of four-step photo-irradiation as shown in FIG. 14 causes the surface temperature of a semiconductor wafer W to increase from the preheating temperature T1 to the processing temperature T3. To be more specific, in the first weak irradiation, photo-irradiation of a semiconductor wafer W is performed with a light-emission output that averages out at the light-emission output L6 and that is kept for 5 to 100 milliseconds within a fluctuation range of plus or minus 30% from the light-emission output L6, which preheats the semiconductor wafer W so that the surface temperature of the wafer W increases to some extent from the preheating temperature T1.

Then in the subsequent buffer irradiation, photo-irradiation of the semiconductor wafer W is performed with a light-emission output that increases from L6 to L7 over a time in the range of 5 to 50 milliseconds, which causes the surface temperature of the semiconductor wafer W to increase further. Then in the subsequent intense irradiation, photo-irradiation of the semiconductor wafer W is performed in accordance with an output waveform that peaks at the light-emission output L8, which causes the surface temperature of the semiconductor wafer W to increase up to the ultimate processing temperature T3. This allows the activation of impurities implanted in the source/drain region 12 and the extension region 13 of the semiconductor wafer W. Note that the processing temperature T3 is 1000° C. or higher. Through the steps described hitherto, an effect similar to that of the second preferred embodiment can be achieved.

In the third preferred embodiment, still in the additional irradiation following the intense irradiation, photo-irradiation of the semiconductor wafer W is performed with a light-emission output that averages out at a light-emission output L9 that is lower than the light-emission output L8 and that is kept for 10 to 100 milliseconds within a fluctuation range of plus or minus 30% from the light-emission output L9, which allows the surface temperature of the semiconductor wafer W to drop over a certain period of time, instead of dropping rapidly. This furthers the progress of the recovery of defects that have been introduced into the silicon substrate 11 at the time of ion implantation. In other words, the photo-irradiation heat treatment according to the third preferred embodiment enables a further increase in the surface temperature of a semiconductor wafer W so as to reduce the sheet resistance value while preventing the semiconductor wafer W from shattering and, in addition, it enables the recovery of introduced defects.

Fourth Preferred Embodiment

Figure 15:
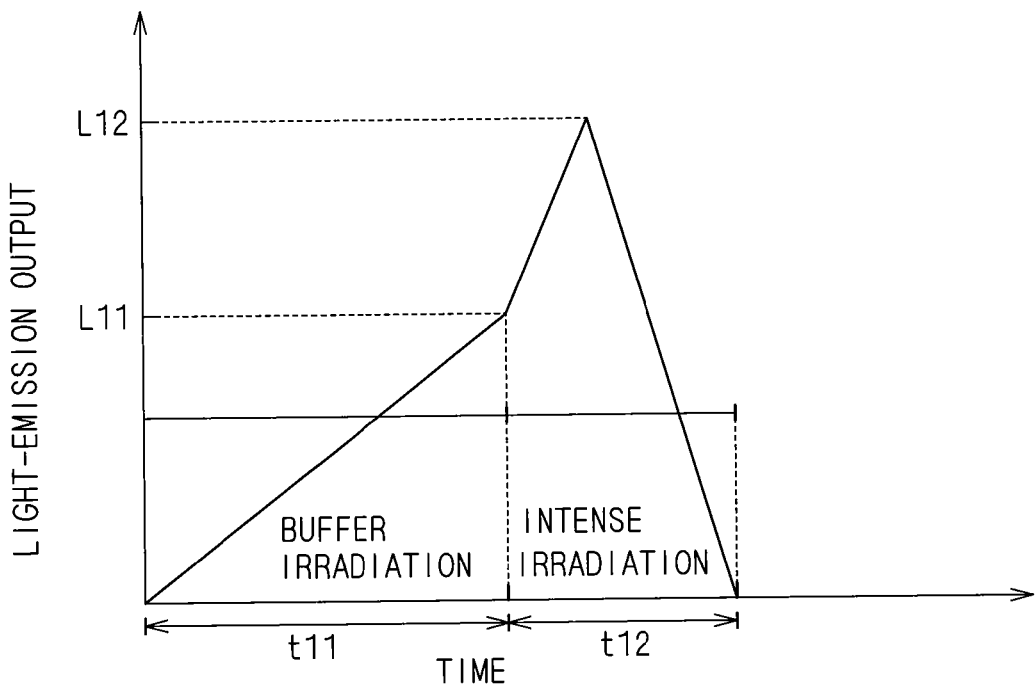
FIG. 15 shows another example of a profile of the light-emission output of a flash lamp.

Next, a fourth preferred embodiment of the present invention will be described. A heat treatment apparatus of the fourth preferred embodiment is identical in configuration to that of the first preferred embodiment. The procedure for processing a semiconductor wafer W according to the fourth preferred embodiment is also generally the same as that in the first preferred embodiment. The fourth preferred embodiment differs from the first preferred embodiment in the output waveform of the light-emission output of a flash lamp FL. FIG. 15 shows a profile of the light-emission output of a flash lamp FL according to the fourth preferred embodiment. The light-emission output of a flash lamp FL is almost proportional to the current flowing through the flash lamp FL, so that the profile of the light-emission output of a flash lamp FL can be controlled by controlling the waveform of a pulse signal that is output to the gate of the switching element 96.

The output waveform of light shown in FIG. 15 can be regarded as executing two-step photo-irradiation. Specifically, such two-step irradiation includes intense irradiation where the photo-irradiation of a semiconductor wafer W is performed in accordance with a relatively high-peaked output waveform; and buffer irradiation where the photo-irradiation of the semiconductor wafer W is performed with a gradually increasing light-emission output, as a preliminary step to the intense irradiation.

According to the fourth preferred embodiment, a buffer irradiation step is performed as the first step as shown in FIG. 15 as the buffer irradiation, in which the light-emission output of a flash lamp FL gradually increases from zero to L11. A photo-irradiation time t11 in the buffer irradiation step is between 1 and 100 milliseconds. As described, the buffer irradiation step is a step, prior to the intense irradiation, of performing photo-irradiation of a semiconductor wafer W with a light-emission output that increases from zero to the light-emission output L11 over a time in the range of 1 to 100 milliseconds.

Subsequent to the buffer irradiation step, the final photo-irradiation of the semiconductor wafer W is performed as shown in FIG. 15 as the intense irradiation in which the flash lamps FL emit light in accordance with an output waveform that peaks at an emission output L12 that is higher than the light-emission output L11. A photo-irradiation time t12 in the intense irradiation step is between 1 and 5 milliseconds. As described, the intense irradiation step is a step, subsequent to the buffer irradiation step, of performing photo-irradiation of a semiconductor wafer W in accordance with an output waveform that peaks at the light-emission output L12 that is higher than the light-emission output L11 and whose irradiation time is between 1 and 5 milliseconds. Note that the total of the photo-irradiation time t11 in the buffer irradiation step and the photo-irradiation time t12 in the intense irradiation step is not more than one second. It is also noted that the rate of increase of the light-emission output in the buffer irradiation step (the inclination from zero to the light-emission output L11 in FIG. 15) is between 10 and 40% of the rate of increase of the light-emission output until the light-emission output reaches a peak in the intense irradiation step (the inclination from the light-emission output L11 to the light-emission output L12).

The execution of the two-step photo-irradiation as shown in FIG. 15 causes the surface temperature of the semiconductor wafer W to increase from the preheating temperature T1 to the processing temperature T3. To be more specific, in the initial buffer irradiation, the photo-irradiation of a semiconductor wafer W is performed with a light-emission output that increases from zero to the light-emission output L11 over a time in the range of 1 to 100 milliseconds, which preheats the semiconductor wafer W so that the surface temperature of the wafer W increases to some extent from the preheating temperature T1. Then, in the subsequent intense irradiation, the photo-irradiation of the semiconductor wafer W is performed in accordance with an output waveform that peaks at the light-emission output L12, which causes the surface temperature of the semiconductor wafer W to increase to the ultimate processing temperature T3. This allows the activation of impurities implanted in the source/drain region 12 and the extension region 13 of the semiconductor wafer W. Note that the processing temperature T3 is 1000° C. or higher.

In the fourth preferred embodiment, intense irradiation with a higher peak is applied to a semiconductor wafer W that has been preheated to some extent by the buffer irradiation, which allows a further increase in the surface temperature of the semiconductor wafer W so as to increase the efficiency of the activation of implanted impurities, thus enabling an effective reduction in the sheet resistance value.

Also in the fourth preferred embodiment, the intense irradiation step is performed after the execution of the buffer irradiation step in which the light-emission output gradually increases up to L11, which reduces the range of an instantaneous increase in the surface temperature of a semiconductor wafer W at the time of the intense irradiation. This consequently reduces the warping of a semiconductor wafer W in the intense irradiation step, thus inhibiting damage to the semiconductor wafer W and preventing the semiconductor wafer W from being shattered. In other words, the photo-irradiation heat treatment according to the fourth preferred embodiment enables a further increase in the surface temperature of the semiconductor wafer W so as to reduce the sheet resistance value while preventing the semiconductor wafer W from shattering.

Fifth Preferred Embodiment

Figure 16:
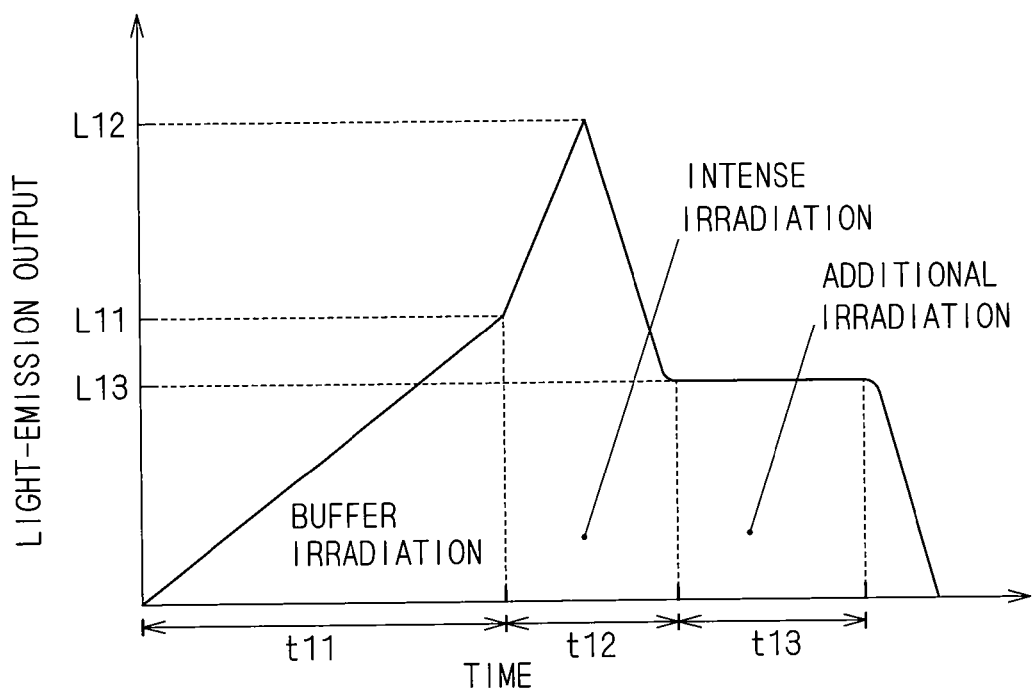
FIG. 16 shows another example of a profile of the light-emission output of a flash lamp.

Next, a fifth preferred embodiment of the present invention will be described. A heat treatment apparatus according to the fifth preferred embodiment is identical in configuration to that of the first preferred embodiment. The procedure for processing a semiconductor wafer W according to the fifth preferred embodiment is also generally the same as that in the first preferred embodiment. The fifth preferred embodiment differs from the first preferred embodiment in the output waveform of the light-emission output of a flash lamp FL. FIG. 16 shows a profile of the light-emission output of a flash lamp FL according to the fifth preferred embodiment. The light-emission output of a flash lamp FL is almost proportional to the current flowing through the flash lamp FL, so that the profile of the light-emission output of a flash lamp FL can be controlled by controlling the waveform of a pulse signal that is output to the gate of the switching element 96.

The output waveform shown in FIG. 16 can be regarded as executing three-step photo-irradiation. Specifically, three-step irradiation includes intense irradiation in which photo-irradiation of a semiconductor wafer W is performed in accordance with a relatively high-peaked output waveform; buffer irradiation in which photo-irradiation of the semiconductor wafer W is performed with a gradually increasing light-emission output, as a preliminary step to the intense irradiation; and additional irradiation in which photo-irradiation of the semiconductor wafer W is performed again after the peak of the intense irradiation, in accordance with a relatively low and flat output waveform.

From among the above three steps of photo-irradiation, the buffer irradiation and the intense irradiation are identical to those described in the fourth preferred embodiment. That is, buffer irradiation is applied to a semiconductor wafer W with a light-emission output that increases from zero to the light-emission output L11 over a time in the range of 1 to 100 milliseconds, and then intense irradiation is performed in accordance with an output waveform that peaks at the light-emission output L12 that is higher than the light-emission output L11 and whose irradiation time is between 1 and 5 milliseconds.

In the fifth preferred embodiment, an additional irradiation step is performed subsequent to the intense irradiation step, as shown in FIG. 16 as the additional irradiation, in which the flash lamps FL emit light in accordance with a generally flat output waveform with an average light-emission output L13. The light-emission output in the additional irradiation step averages out at the light-emission output L13 and falls within a fluctuation range of plus or minus 30% from the light-emission output L13. The light-emission output L13 in the additional irradiation step is lower than the peak light-emission output L12 in the intense irradiation step. Further, a photo-irradiation time t13 in the additional irradiation step is between 10 and 100 milliseconds. As described, the additional irradiation step is a step of performing photo-irradiation of a semiconductor wafer W with a light-emission output that averages out at the light-emission output L13 that is lower than the light-emission output L12 and that is kept for 10 to 100 milliseconds within a fluctuation range of plus or minus 30% from the light-emission output L13. Note that the total of the photo-irradiation time t11 in the buffer irradiation step, the photo-irradiation time t12 in the intense irradiation step, and the photo-irradiation time t13 in the additional irradiation step is not more than one second.

The execution of three-step photo-irradiation as shown in FIG. 16 causes the surface temperature of the semiconductor wafer W to increase from the preheating temperature T1 to the processing temperature T3. To be more specific, in the initial buffer irradiation, the photo-irradiation of a semiconductor wafer W is performed with a light-emission output that increases from zero to the light-emission output L11 over a time in the range of 1 to 100 milliseconds, which preheats the semiconductor wafer W so that the surface temperature of the wafer W increases to some extent from the preheating temperature T1. Then, in the subsequent intense irradiation, the photo-irradiation of the semiconductor wafer W is performed in accordance with an output waveform that peaks at the light-emission output L12, which causes the surface temperature of the semiconductor wafer W to increase up to the ultimate processing temperature T3. This allows the activation of impurities implanted in the source/drain region 12 and the extension region 13 of the semiconductor wafer W. Note that the processing temperature T3 is 1000° C. or higher. Through the steps described hitherto, an effect similar to that of the fourth preferred embodiment can be achieved.

According to the fifth preferred embodiment, additionally in the additional irradiation subsequent to the intense irradiation, the photo-irradiation of a semiconductor wafer W is performed with a light-emission output that averages out at the light-emission output L13 that is lower than the light-emission output L12 and that is kept for 10 to 100 milliseconds within a fluctuation range of plus or minus 30% from the light-emission output L13, which causes the surface temperature of the semiconductor wafer W to drop from the processing temperature T3 over a certain period of time, instead of dropping rapidly. This furthers the progress of the recovery of defects that have been introduced in the silicon substrate 11 at the time of ion implantation. In other words, the photo-irradiation heat treatment according to the fifth preferred embodiment enables a further increase in the surface temperature of a semiconductor wafer W so as to reduce the sheet resistance value while preventing the semiconductor wafer W from shattering, and in addition, it enables the recovery of introduced defects.

Sixth Preferred Embodiment

Figure 17:
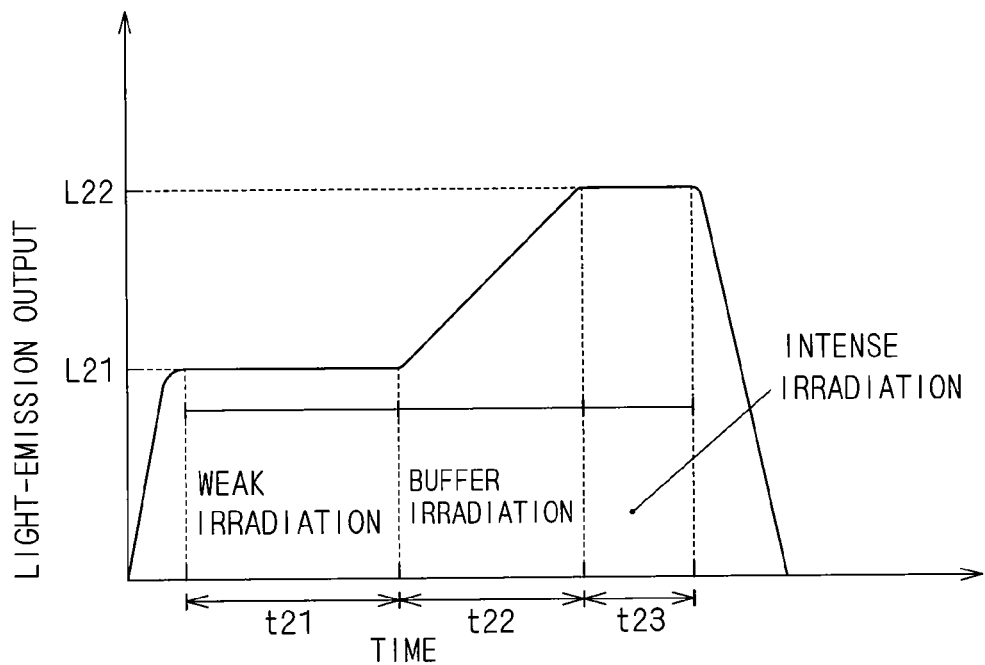
FIG. 17 shows another example of a profile of the light-emission output of a flash lamp.

Next, a sixth preferred embodiment of the present invention will be described. A heat treatment apparatus according to the sixth preferred embodiment is identical in configuration to that of the first preferred embodiment. The procedure for processing a semiconductor wafer W according to the sixth preferred embodiment is also generally the same as that in the first preferred embodiment. The sixth preferred embodiment differs from the first preferred embodiment in the output waveform of the light-emission output of a flash lamp FL. FIG. 17 shows a profile of the light-emission output of a flash lamp FL according to the sixth preferred embodiment. The light-emission output of a flash lamp FL is almost proportional to the current flowing through the flash lamp FL, so that the profile of the light-emission output of a flash lamp FL can be controlled by controlling the waveform of a pulse signal that is output to the gate of the switching element 96.

The output waveform of light shown in FIG. 17 can be regarded as executing three-step photo-irradiation. Specifically, such three-step irradiation includes weak irradiation in which photo-irradiation of a semiconductor wafer W is performed in accordance with a relatively low and flat output waveform; intense irradiation in which photo-irradiation of the semiconductor wafer W is performed in accordance with a relatively high and flat output waveform; and buffer irradiation in which photo-irradiation of the semiconductor wafer W is performed with a light-emission output that gradually increases from the light-emission output in the weak irradiation to the light-emission output in the intense irradiation.

In the sixth preferred embodiment, the weak irradiation step is first performed as shown in FIG. 17 as the weak irradiation, in which the flash lamps FL emit light in accordance with a generally flat output waveform with an average light-emission output L21. The light-emission output in the weak irradiation step averages out at the light-emission output L21 and falls within a fluctuation range of plus or minus 30% from the light-emission output L21. Further, a photo-irradiation time t21 in the weak irradiation step is between 5 and 100 milliseconds. As described, the weak irradiation step is a step of performing photo-irradiation of a semiconductor wafer W with a light-emission output that averages out at the light-emission output L21 and that is kept for 5 to 100 milliseconds within a fluctuation range of plus or minus 30% from the light-emission output L21.

Subsequent to the weak irradiation step, a buffer irradiation step is performed as shown in FIG. 17 as the buffer irradiation, in which the light-emission output of a flash lamp FL gradually increases from L21 to L22. The light-emission output L22 is higher than the light-emission output L21. A photo-irradiation time t22 in the buffer irradiation step is between 5 and 50 milliseconds. As described, the buffer irradiation step is a step, between the weak irradiation step and the intense irradiation step, of performing photo-irradiation of a semiconductor wafer W with a light-emission output that increases from L21 to L22 over a time in the range of 5 to 50 milliseconds.

Subsequent to the buffer irradiation step, the intense irradiation step is performed as shown in FIG. 17 as the intense irradiation, in which the flash lamps FL emit light in accordance with a generally flat output waveform with an average light-emission output L22. The light-emission output in the intense irradiation step averages out at the light-emission output L22 and falls within a fluctuation range of plus or minus 30% from the light-emission output L22. Further, a photo-irradiation time t23 in the intense irradiation step is between 1 and 10 milliseconds. As described, the intense irradiation step is a step of performing photo-irradiation of a semiconductor wafer W with a light-emission output that averages out at the light-emission output L22 and that is kept for 1 and 10 milliseconds within a fluctuation range of plus or minus 30% from the light-emission output L22. Note that the total of the photo-irradiation time t21 in the weak irradiation step, the photo-irradiation time t22 in the buffer irradiation step, and the photo-irradiation time t23 in the intense irradiation step is not more than one second.

The execution of three-step photo-irradiation as shown in FIG. 17 causes the surface temperature of the semiconductor wafer W to increase from the preheating temperature T1 to the processing temperature T3. To be more specific, in the initial weak irradiation, the photo-irradiation of a semiconductor wafer W is performed with a light-emission output that averages out at the light-emission output L21 and that is kept for 5 to 100 milliseconds within a fluctuation range of plus or minus 30% from the light-emission output L21, which preheats the semiconductor wafer W so that the surface temperature of the wafer W increases to some extent from the preheating temperature T1.

In the subsequent buffer irradiation, photo-irradiation of the semiconductor wafer W is performed with a light-emission output that increases from L21 to L22 over a time in the range of 5 to 50 milliseconds, which causes the surface temperature of the semiconductor wafer W to increase further. Then, in the subsequent intense irradiation, photo-irradiation of the semiconductor wafer W is performed with a light-emission output that averages out at the light-emission output L22 and that is kept for 1 to 10 milliseconds within a fluctuation range of plus or minus 30% from the light-emission output L22, which causes the surface temperature of the semiconductor wafer W to increase up to the ultimate processing temperature T3. This allows the activation of impurities implanted in the source/drain region 12 and the extension region 13 of the semiconductor wafer W. Note that the processing temperature T3 is 1000° C. or higher.

In the sixth preferred embodiment, intense irradiation is applied to a semiconductor wafer W that has been preheated to some extent by the weak irradiation, which allows a further increase in the surface temperature of the semiconductor wafer W so as to increase the efficiency of the activation of implanted impurities, thus enabling an effective reduction in the sheet resistance value.

Also in the sixth preferred embodiment, the buffer irradiation step is performed between the weak irradiation step and the intense irradiation step in order to gradually increase the light-emission output from L21 to L22 over a time in the range of 5 to 50 milliseconds. The execution of such buffer irradiation reduces the range of an instantaneous increase in the surface temperature of a semiconductor wafer W at the time of intense irradiation, as compared with the case where there is a direct transition between the weak irradiation step and the intense irradiation step. This consequently reduces the warping of a semiconductor wafer W in the intense irradiation step, thus preventing damage to the semiconductor wafer W and preventing the semiconductor wafer W from shattering. In other words, the photo-irradiation heat treatment according to the sixth preferred embodiment enables a further increase in the surface temperature of a semiconductor wafer W so as to reduce the sheet resistance value while preventing the semiconductor wafer W from shattering.

Seventh Preferred Embodiment

Figure 18:
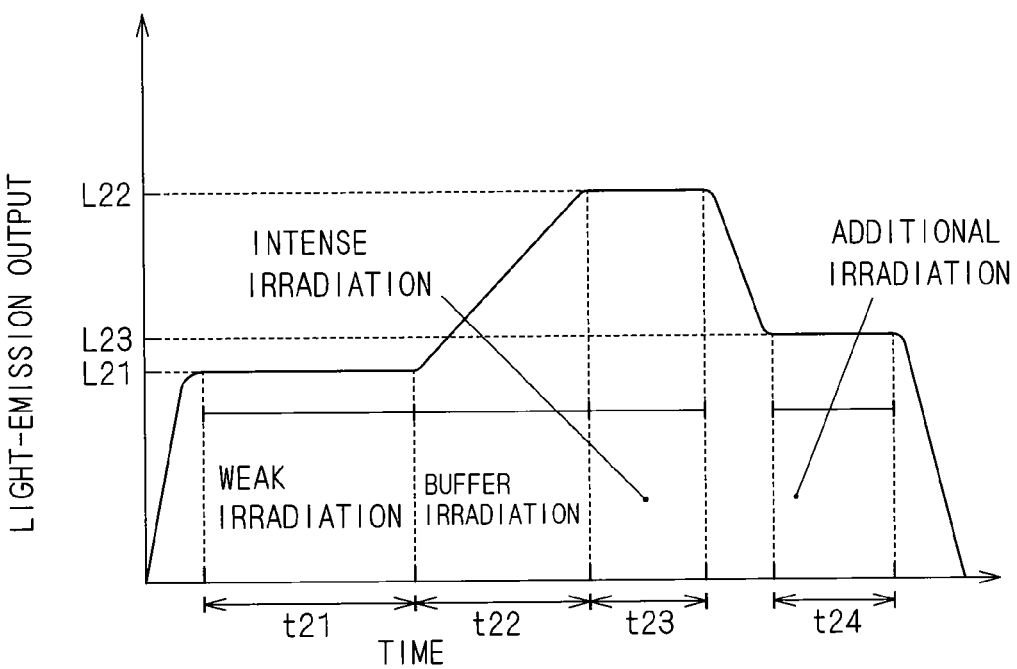
FIG. 18 shows another example of a profile of the light-emission output of a flash lamp.

Next, a seventh preferred embodiment of the present invention will be described. A heat treatment apparatus according to the seventh preferred embodiment is identical in configuration to that of the first preferred embodiment. The procedure for processing a semiconductor wafer W according to the seventh preferred embodiment is also generally the same as that in the first preferred embodiment. The seventh preferred embodiment differs from the first preferred embodiment in the output waveform of the light-emission output of a flash lamp FL. FIG. 18 shows a profile of the light-emission output of a flash lamp FL according to the seventh preferred embodiment. The light-emission output of a flash lamp FL is almost proportional to the current flowing through the flash lamp FL, so that the profile of the light-emission output of a flash lamp FL can be controlled by controlling the waveform of a pulse signal that is output to the gate of the switching element 96.

The output waveform of light shown in FIG. 18 can be regarded as executing four-step photo-irradiation. Specifically, such four-step irradiation includes weak irradiation in which photo-irradiation of a semiconductor wafer W is performed in accordance with a relatively low and flat output waveform; intense irradiation in which photo-irradiation of a semiconductor wafer W is performed in accordance with a relatively high and flat output waveform; buffer irradiation in which photo-irradiation of a semiconductor wafer W is performed with a light-emission output that increases gradually from the light-emission output in the weak irradiation to the light-emission output in the intense irradiation; and additional irradiation in which photo-irradiation of a semiconductor wafer W is performed again after the intense irradiation, in accordance with a relatively low and flat output waveform.

From among the above four steps of photo-irradiation, the weak irradiation, the buffer irradiation, and the intense irradiation are identical to those described in the sixth preferred embodiment. However, the photo-irradiation time t23 in the intense irradiation step is between 5 and 10 milliseconds in the seventh preferred embodiment. Specifically, in the seventh preferred embodiment, the weak irradiation is performed with a light-emission output that averages out at the light-emission output L21 and that is kept for 5 to 100 milliseconds within a fluctuation range of plus or minus 30% from the light-emission output L21, then buffer irradiation is performed with a light-emission output that increases from L21 to L22 over a time in the range of 5 to 50 milliseconds, and then intense irradiation is performed with a light-emission output that averages out at the light-emission output L22 and that is kept for 5 to 10 milliseconds within a fluctuation range of plus or minus 30% from the light-emission output L22.

In the seventh preferred embodiment, an additional irradiation step is performed subsequent to the intense irradiation step as shown in FIG. 18 as the additional irradiation, in which the flash lamps FL emit light in accordance with a generally flat output waveform with an average light-emission output L23. The light-emission output in the additional irradiation step averages out at the light-emission output L23 and falls within a fluctuation range of plus or minus 30% from the light-emission output L23. The light-emission output L23 in the additional irradiation step is lower than the light-emission output L22 in the intense irradiation step. Further, a photo-irradiation time t24 in the additional irradiation step is between 10 and 100 milliseconds. As described, the additional irradiation step is a step of performing photo-irradiation of a semiconductor wafer W with a light-emission output that averages out at the light-emission output L23 that is lower than the light-emission output L22 and that is kept for 10 to 100 milliseconds within a fluctuation range of plus or minus 30% from the light-emission output L23. Note that the total of the photo-irradiation time t21 in the weak irradiation step, the photo-irradiation time t22 in the buffer irradiation step, the photo-irradiation time t23 in the intense irradiation step, and the photo-irradiation time t24 in the additional irradiation step is not more than one second.

The execution of the four-step photo-irradiation as shown in FIG. 18 causes the surface temperature of the semiconductor wafer W to increase from the preheating temperature T1 to the processing temperature T3. To be more specific, in the initial weak irradiation, the photo-irradiation of a semiconductor wafer W is performed with a light-emission output that averages out at the light-emission output L21 and that is kept for 5 to 100 milliseconds within a fluctuation range of plus or minus 30% from the light-emission output L21, which preheats the semiconductor wafer W so that the surface temperature of the wafer W increases to some extent from the preheating temperature T1.

In the subsequent buffer irradiation, photo-irradiation of the semiconductor wafer W is performed with a light-emission output that increases from L21 to L22 over a time in the range of 5 to 50 milliseconds, which causes the surface temperature of the semiconductor wafer W to increase further. Then, in the subsequent intense irradiation, photo-irradiation of the semiconductor wafer W is performed with a light-emission output that averages out at the light-emission output L22 and that is kept for 5 to 10 milliseconds within a fluctuation range of plus or minus 30% from the light-emission output L22, which causes the surface temperature of the semiconductor wafer W to increase up to the ultimate processing temperature T3. This allows the activation of impurities implanted in the source/drain region 12 and the extension region 13 of the semiconductor wafer W. Note that the processing temperature T3 is 1000° C. or higher. Through the steps described hitherto, an effect similar to that in the sixth preferred embodiment can be achieved.

In the seventh preferred embodiment, additionally in the additional irradiation subsequent to the intense irradiation, photo-irradiation of the semiconductor wafer W is performed with a light-emission output that averages out at the light-emission output L23 that is lower than the light-emission output L22 and that is kept for 10 and 100 milliseconds within a fluctuation range of plus or minus 30% from the light-emission output L23, which causes the surface temperature of the semiconductor wafer W to drop from the processing temperature T3 over a certain period of time, instead of dropping rapidly. This furthers the progress of the recovery of defects that have been introduced in the silicon substrate 11 at the time of ion implantation. In other words, the photo-irradiation heat treatment according to the seventh preferred embodiment enables a further increase in the surface temperature of a semiconductor wafer W so as to reduce the sheet resistance value while preventing the semiconductor wafer W from shattering, and in addition, it enables the recovery of introduced defects.

Eighth Preferred Embodiment

Figure 19:
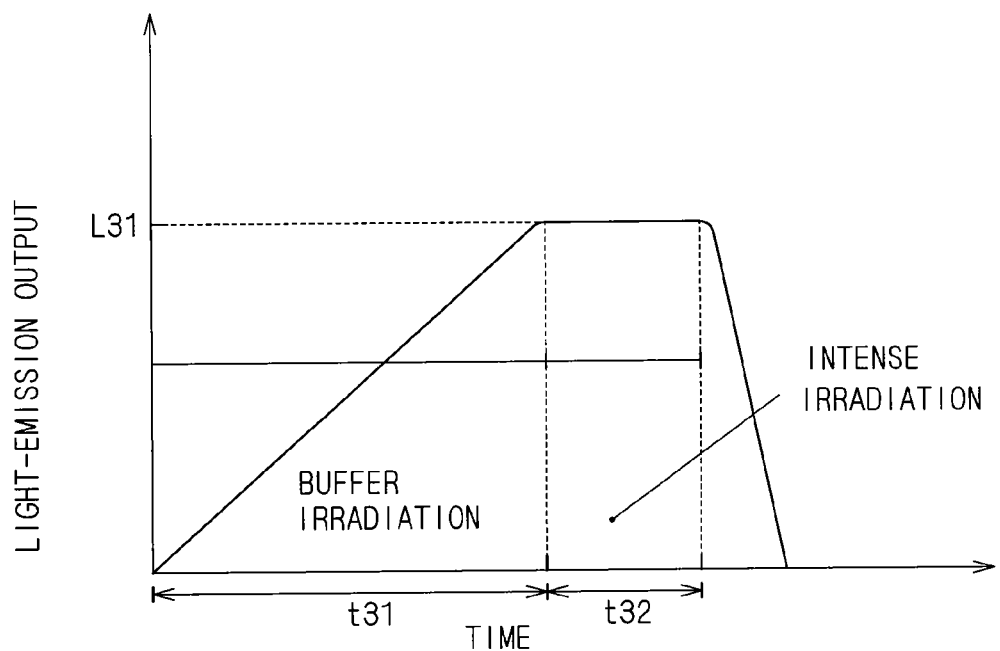
FIG. 19 shows another example of a profile of the light-emission output of a flash lamp.

Next, an eighth preferred embodiment of the present invention will be described. A heat treatment apparatus according to the eighth preferred embodiment is identical in configuration to that of the first preferred embodiment. The procedure for processing a semiconductor wafer W according to the eighth preferred embodiment is also generally the same as that in the first preferred embodiment. The eighth preferred embodiment differs from the first preferred embodiment in the output waveform of the light-emission output of a flash lamp FL. FIG. 19 shows a profile of the light-emission output of a flash lamp FL according to the eighth preferred embodiment. The light-emission output of a flash lamp FL is almost proportional to the current flowing through the flash lamp FL, so that the profile of the light-emission output of a flash lamp FL can be controlled by controlling the waveform of a pulse signal that is output to the gate of the switching element 96.

The output waveform of light in FIG. 19 can be regarded as executing two-step photo-irradiation. Specifically, such two-step irradiation includes intense irradiation in which photo-irradiation of a semiconductor wafer W is performed in accordance with a relatively high and flat output waveform; and buffer irradiation in which photo-irradiation of the semiconductor wafer W is performed with a gradually increasing light-emission output, as a preliminary step to the intense irradiation.

In the eighth preferred embodiment, the buffer irradiation step is first performed as shown in FIG. 19 as the buffer irradiation, in which the light-emission output of a flash lamp FL gradually increases from zero to L31. A photo-irradiation time t31 in the buffer irradiation step is between 1 and 100 milliseconds. As described, the buffer irradiation step is a step, prior to an intense irradiation step, of performing photo-irradiation of a semiconductor wafer W with a light-emission output that increases from zero to the light-emission output L31 over a time in the range of 1 to 100 milliseconds.

Subsequent to the buffer irradiation step, the intense irradiation step is performed as shown in FIG. 19 as the intense irradiation, in which the flash lamps FL emit light in accordance with a generally flat output waveform with an average light-emission output L31. The light-emission output in the intense irradiation step averages out at the light-emission output L31 and falls within a fluctuation range of plus or minus 30% from the light-emission output L31. Further, a photo-irradiation time t32 in the intense irradiation step is between 1 and 10 milliseconds. As described, the intense irradiation step is a step of performing photo-irradiation of a semiconductor wafer W with a light-emission output that averages out at the light-emission output L31 and that is kept for 1 to 10 milliseconds within a fluctuation range of plus or minus 30% from the light-emission output L31. Note that the total of the photo-irradiation time t31 in the buffer irradiation step and the photo-irradiation time t32 in the intense irradiation step is not more than one second.

The execution of the two-step photo-irradiation as shown in FIG. 19 causes the surface temperature of the semiconductor wafer W to increase from the preheating temperature T1 to the processing temperature T3. To be more specific, in the initial buffer irradiation, the photo-irradiation of a semiconductor wafer W is performed with a light-emission output that increases from zero to the light-emission output L31 over a time in the range of 1 to 100 milliseconds, which preheats the semiconductor wafer W so that the surface temperature of the wafer W increases to some extent from the preheating temperature T1. Then, in the subsequent intense irradiation, photo-irradiation of a semiconductor wafer W is performed with a light-emission output that averages out at the light-emission output L31 and that is kept for 1 to 10 milliseconds within a fluctuation range of plus or minus 30% from the light-emission output L31, which causes the surface temperature of the semiconductor wafer W to increase up to the ultimate processing temperature T3. This allows the activation of impurities implanted in the source/drain region 12 and the extension region 13 of the semiconductor wafer W. Note that the processing temperature T3 is 1000° C. or higher.

In the eighth preferred embodiment, intense irradiation is applied to the semiconductor wafer W that has been preheated to some extent by the buffer irradiation, which allows a further increase in the surface temperature of the semiconductor wafer W so as to increase the efficiency of the activation of implanted impurities, thus enabling an effective reduction in the sheet resistance value.

Also in the eighth preferred embodiment, the intense irradiation step is performed after the execution of the buffer irradiation step in which the light-emission output gradually increases up to L31, which reduces the range of an instantaneous increase in the surface temperature of a semiconductor wafer W at the time of intense irradiation. This consequently reduces the warping of a semiconductor wafer W in the intense irradiation step, thus inhibiting damage to the semiconductor wafer W and preventing the semiconductor wafer W from being shattered. In other words, the photo-irradiation heat treatment according to the eighth preferred embodiment enables a further increase in the surface temperature of the semiconductor wafer W so as to reduce the sheet resistance value while preventing the semiconductor wafer W from shattering.

Ninth Preferred Embodiment

Figure 20:
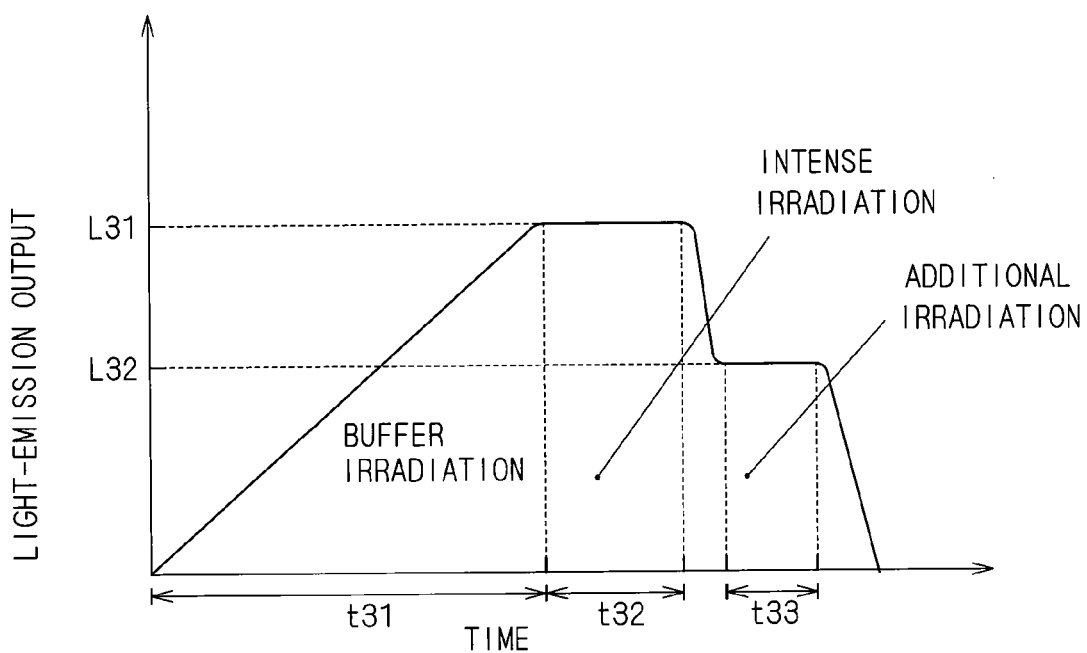
FIG. 20 shows another example of a profile of the light-emission output of a flash lamp.

Next, a ninth preferred embodiment of the present invention will be described. A heat treatment apparatus according to the ninth preferred embodiment is identical in configuration to that of the first preferred embodiment. The procedure for processing a semiconductor wafer W according to the ninth preferred embodiment is also generally the same as that in the first preferred embodiment. The ninth preferred embodiment differs from the first preferred embodiment in the output waveform of the light-emission output of a flash lamp FL. FIG. 20 shows a profile of the light-emission output of a flash lamp FL according to the ninth preferred embodiment. The light-emission output of a flash lamp FL is almost proportional to the current flowing through the flash lamp FL, so that the profile of the light-emission output of the flash lamp FL can be controlled by controlling the waveform of a pulse signal that is output to the gate of the switching element 96.

The output waveform of light shown in FIG. 20 can be regarded as executing three-step photo-irradiation. Specifically, such three-step irradiation includes intense irradiation in which photo-irradiation of a semiconductor wafer W is performed in accordance with a relatively high and flat output waveform; buffer irradiation in which photo-irradiation of the semiconductor wafer W is performed with a gradually increasing light-emission output, as a preliminary step to the intense irradiation; and additional irradiation in which photo-irradiation of the semiconductor wafer W is performed again after the intense irradiation, in accordance with a relatively low and flat output waveform.

From among the above three steps of photo-irradiation, the buffer irradiation and the intense irradiation are identical to those described in the eighth preferred embodiment. However, a photo-irradiation time t32 in the intense irradiation step is between 5 and 10 milliseconds in the ninth preferred embodiment. Specifically, in the ninth preferred embodiment, buffer irradiation of a semiconductor wafer W is first performed with a light-emission output of a flash lamp FL that increases from zero to the light-emission output L31 over a time in the range of 1 to 100 milliseconds, and then intense irradiation is performed with a light-emission output that averages out at the light-emission output L31 and that is kept for 5 to 10 milliseconds within a fluctuation range of plus or minus 30% from the light-emission output L31.

In the ninth preferred embodiment, an additional irradiation step is performed subsequent to the intense irradiation step as shown in FIG. 20 as the additional irradiation, in which the flash lamps FL emit light in accordance with a generally flat output waveform with an average light-emission output L32. The light-emission output in the additional irradiation step averages out at the light-emission output L32 and falls within a fluctuation range of plus or minus 30% from the light-emission output L32. The light-emission output L32 in the additional irradiation step is lower than the light-emission output L31 in the intense irradiation step. Further, a photo-irradiation time t33 in the additional irradiation step is between 10 and 100 milliseconds. As described, the additional irradiation step is a step of performing photo-irradiation of a semiconductor wafer W with a light-emission output that averages out at the light-emission output L32 that is lower than the light-emission output L31 and that is kept for 10 to 100 milliseconds within a fluctuation range of plus or minus 30% from the light-emission output L32. Note that the total of the photo-irradiation time t31 in the buffer irradiation step, the photo-irradiation time t32 in the intense irradiation step, and the photo-irradiation time t33 in the additional irradiation step is not more than one second.

The execution of three-step photo-irradiation as shown in FIG. 20 causes the surface temperature of the semiconductor wafer W to increase from the preheating temperature T1 to the processing temperature T3. To be more specific, in the initial buffer irradiation, the photo-irradiation of a semiconductor wafer W is performed with a light-emission output that increases from zero to the light-emission output L31 over a time in the range of 1 to 100 milliseconds, which preheats the semiconductor wafer W so that the surface temperature of the wafer W increases to some extent from the preheating temperature T1. Then, in the subsequent intense irradiation, photo-irradiation of the semiconductor wafer W is performed with a light-emission output that averages out at the light-emission output L31 and that is kept for 5 to 10 milliseconds within a fluctuation range of plus or minus 30% from the light-emission output L31, which causes the surface temperature of the semiconductor wafer W to increase up to the ultimate processing temperature T3. This allows the activation of impurities implanted in the source/drain region 12 and the extension region 13 of the semiconductor wafer W. Note that the processing temperature T3 is 1000° C. or higher. Through the steps described hitherto, an effect similar to that of the eighth preferred embodiment can be achieved.

In the ninth preferred embodiment, additionally in the additional irradiation subsequent to the intense irradiation, the photo-irradiation of the semiconductor wafer W is performed with a light-emission output that averages out at the light-emission output L32 that is lower than the light-emission output L31 and that is kept for 10 to 100 milliseconds within a fluctuation range of plus or minus 30% from the light-emission output L32, which causes the surface temperature of the semiconductor wafer W to drop from the processing temperature T3 over a certain period of time, instead of dropping rapidly. This furthers the progress of the recovery of defects that have been introduced into the silicon substrate 11 at the time of ion implantation. In other words, the photo-irradiation heat treatment according to the ninth preferred embodiment enables a further increase in the surface temperature of a semiconductor wafer W so as to reduce the sheet resistance value while preventing the semiconductor wafer W from shattering, and in addition, it enables the recovery of introduced defects.

Tenth Preferred Embodiment

Figure 21:
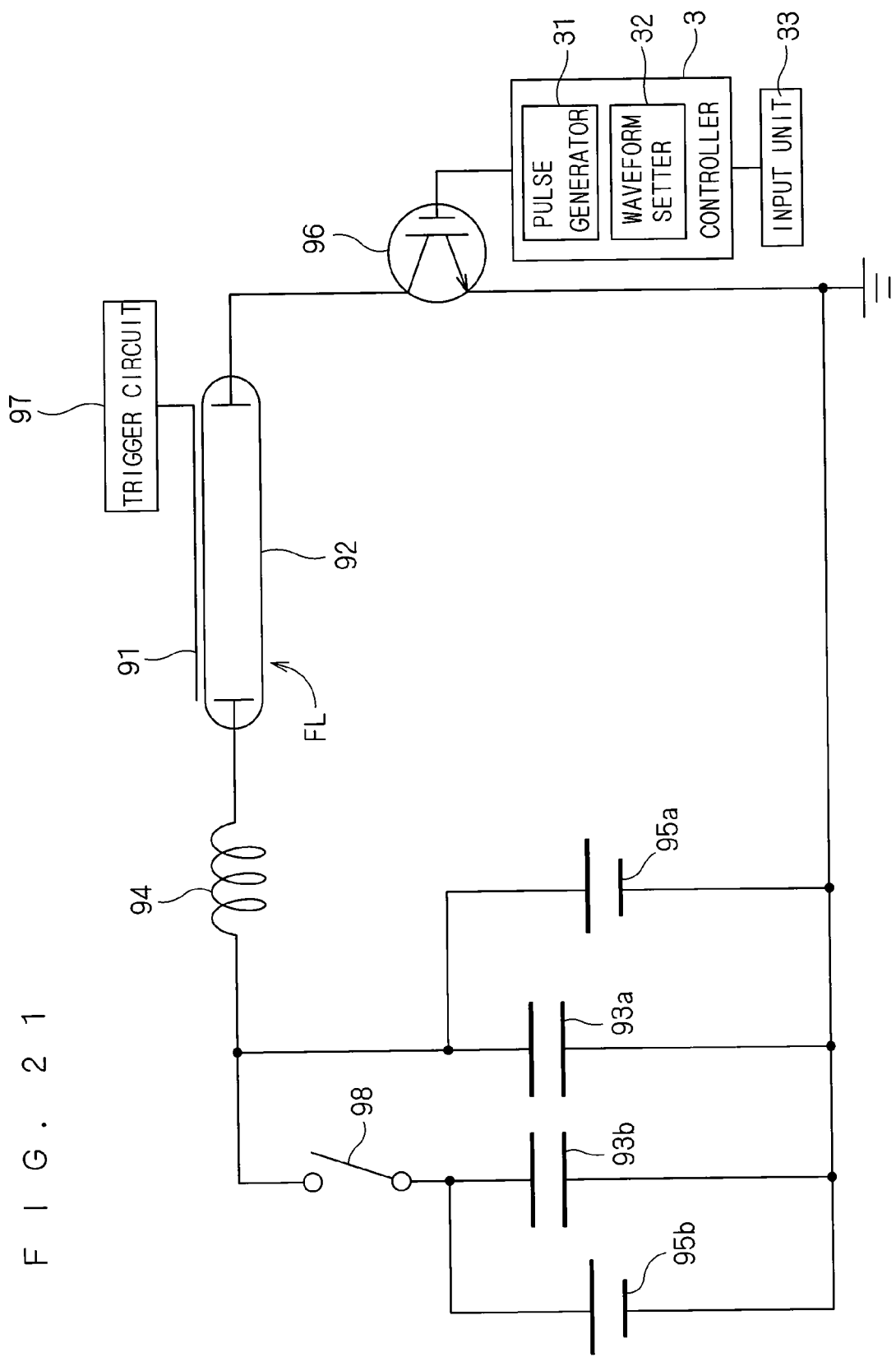
FIG. 21 shows another example of a driving circuit for a flash lamp.

Next, a tenth preferred embodiment of the present invention will be described. FIG. 21 shows a driving circuit for a flash lamp FL according to the tenth preferred embodiment. In the tenth preferred embodiment, two capacitors 93a and 93b for supplying power to a flash lamp FL are provided in parallel. A predetermined voltage is applied from a power supply unit 95a to the capacitor 93a, which is charged in response to the applied voltage. Similarly, a predetermined voltage is applied from a power supply unit 95b to the capacitor 93b, which is charged in response to the applied voltage. A switch 98 that allows selection of whether or not to supply power from the capacitor 93b is under the control of the controller 3.

The remaining parts of the configuration of the heat treatment apparatus according to the tenth preferred embodiment are identical to those in the first preferred embodiment; in the case of FIG. 21, the same components as those in the first preferred embodiment are denoted by the same reference numerals. The procedure for processing a semiconductor wafer W according to the tenth preferred embodiment is also generally the same as that in the first preferred embodiment. The profile of the light-emission output of a flash lamp FL according to the tenth preferred embodiment may be similar to any of those in the second to the fifth preferred embodiments.

In the tenth preferred embodiment, in the case where the profile of the light-emission output of a flash lamp FL is similar to that in the second preferred embodiment (FIG. 13) or that in the third preferred embodiment (FIG. 14), the switch 98 is open in both the weak irradiation step and the buffer irradiation step so that power is supplied from only the capacitor 93a to the flash lamp FL. The switch 98 is then closed under the control of the controller 3 at the time of the transition from the buffer irradiation step to the intense irradiation step, so that in the intense irradiation step, power is supplied not only from the capacitor 93a but also from the capacitor 93b to the flash lamp FL. In the case of using the profile of the light-emission output according to the third preferred embodiment, both the capacitors 93a and 93b supply power to the flash lamp FL in the additional irradiation step.

In the case where the profile of the light-emission output of a flash lamp FL is similar to that in the fourth preferred embodiment (FIG. 15) or that in the fifth preferred embodiment (FIG. 16), the switch 98 is open in the buffer irradiation step so that power is supplied from only the capacitor 93a to the flash lamp FL. The switch 98 is then closed under the control of the controller 3 at the time of the transition from the buffer irradiation step to the intense irradiation step, so that in the intense irradiation step, power is supplied not only from the capacitor 93a but also from the capacitor 93b to the flash lamp FL. Further, in the case of using the profile of the light-emission output according to the fifth preferred embodiment, both the capacitors 93a and 93b supply power to the flash lamp FL in the additional irradiation step.

Even though the profile of the light-emission output of a flash lamp FL is any of the patterns described in the second to the fifth preferred embodiments, not only the capacitor 93a but also the capacitor 93b supplies power to the flash lamp FL at the time of the transition to the intense irradiation step, which facilitates and ensures the acquisition of a required light-emission output even though the peak in the intense irradiation is high. This also ensures reliable execution of the additional irradiation step.

Variations

While the preferred embodiments according to the invention have been described so far, various modifications of the invention other than those described above are possible without departing from the scope and spirit of the invention. For example, although the rate of increase of the light-emission output in the buffer irradiation step is between 10 and 40% of the rate of increase of the light-emission output until the light-emission output reaches a peak in the intense irradiation step in the second to the fifth preferred embodiments described above, it may preferably be between 15 and 25% in order to reduce damage to a semiconductor wafer W.

Although the profile of the light-emission output of a flash lamp FL may be similar to any of those described in the second to fifth preferred embodiments in the tenth preferred embodiment, it may be similar to any of those described in the sixth to the ninth preferred embodiments. Even in such a case, the intense irradiation step can be executed with reliability, because power is supplied not only from the capacitor 93a but also from the capacitor 93b to the flash lamp FL at the time of the transition to the intense irradiation step.

Moreover, although the two capacitors 93a and 93b are connected in parallel in a single circuit in the tenth preferred embodiment, three or more capacitors may be provided in parallel. As another alternative, different power supply circuits, each having a capacitor, may supply power to a single flash lamp FL.

The means of setting a pulse signal waveform is not limited to inputting parameters, such as a pulse width, one by one from the input unit 33. For instance, an operator may directly and graphically input a waveform with the input unit 33, or may read out a previously set waveform stored in a storage device such as a magnetic disk, or may download a waveform from outside the heat treatment apparatus 1.

While in each of the above-described preferred embodiments, a voltage is applied to the trigger electrodes 91 in synchronization with the timing of the turning on of a pulse signal, the timing of the trigger-voltage application is not limited thereto: A voltage may be applied at any fixed interval irrespective of the pulse signal waveform. Moreover, if a pulse signal has a narrow space width so that the value of a current caused by a certain pulse to flow through a flash lamp FL is to still remain at a given value or more when the flash lamp FL is energized by the next pulse, current will continue to flow as is through the flash lamp FL, in which case it is not necessary to apply the trigger voltage for each pulse. If all the space widths of a pulse signal are narrow as in the above preferred embodiments, the trigger voltage may be applied only when the initial pulse PA is applied. In other words, as long as current flows through a flash lamp FL when a pulse signal is turned on, the timing of the trigger-voltage application is arbitrary.

In each of the above-described preferred embodiments, the lamp house 5 includes 30 flash lamps FL; however, the invention is not limited thereto and the number of flash lamps FL is arbitrary. Moreover, the flash lamps FL are not limited to xenon flash lamps; they may be krypton flash lamps.

In each of the above-described preferred embodiments, IGBTs are used as the switching elements 96; however, the invention is not limited thereto. For example, any transistor or device other than an IGBT may be employed as long as it is capable of turning a circuit on and off in accordance with the waveform of an input pulse signal. It is, however, preferable that an IGBT or a GTO (gate turn-off) thyristor that is suitable for handling a large amount of power should be used as a switching element 96 because light emission from a flash lamp FL consumes a considerably large amount of power.

Alternatively, the circuit configuration may be different from those shown in FIGS. 6 and 18 as long as multi-step photo-irradiation is possible. For example, a plurality of power supply circuits, each having a different coil constant, may be connected to a single flash lamp FL. Moreover, the light source is not limited to a flash lamp FL as long as multi-step photo-irradiation is possible; it may be any element that enables photo-irradiation with an irradiation time of not more than one second, e.g., it may be a laser, for example.

A substrate to be processed by the heat treatment apparatus according to the present invention is not limited to a semiconductor wafer; it may, for example, be a glass substrate for use in a liquid crystal display. Moreover, the technique according to the present invention may be applied to the connection of metal and silicon, or the crystallization of polysilicon.

While the invention has been described in detail, the foregoing description is in all aspects illustrative and not restrictive. It is therefore understood that numerous modifications and variations can be devised without departing from the scope of the invention.

What is claimed is:

1. A heat treatment method for heating a substrate by irradiating the substrate with light, comprising: a first photo-irradiation step of performing photo-irradiation of a substrate with a light-emission output that averages out at a first light-emission output; and a second photo-irradiation step, subsequent to said first photo-irradiation step, of performing photo-irradiation of the substrate in accordance with an output waveform that peaks at a second light-emission output that is higher than said first light-emission output and a maximum light-emission output in said first photo-irradiation step, wherein a total of a photo-irradiation time in said first photo-irradiation step and a photo-irradiation time in said second photo-irradiation step is not more than one second.

2. The heat treatment method according to claim 1, wherein said second light-emission output is 1.5 times or more said first light-emission output.

3. The heat treatment method according to claim 1, wherein the photo-irradiation time in said second photo-irradiation step is between 0.1 and 10 milliseconds.

4. The heat treatment method according to claim 3, wherein the photo-irradiation time in said first photo-irradiation step is not less than five milliseconds.

5. The heat treatment method according to claim 1, wherein the photo-irradiation is performed with a flash lamp in said first photo-irradiation step and in said second photo-irradiation step.

6. A heat treatment method for heating a substrate by irradiating the substrate with light, comprising: a weak irradiation step of performing photo-irradiation of a substrate with a light-emission output that averages out at a first light-emission output and that is kept for 5 to 100 milliseconds within a fluctuation range of plus or minus 30% from the first light-emission output; a buffer irradiation step, subsequent to said weak irradiation step, of performing photo-irradiation of the substrate with a light-emission output that increases from the first light-emission output to a second light-emission output that is higher than the first light-emission output over a time in a range of 5 to 50 milliseconds; and an intense irradiation step, subsequent to said buffer irradiation step, of performing photo-irradiation of the substrate in accordance with an output waveform that peaks at a third light-emission output that is higher than the second light-emission output and whose irradiation time is between 1 and 5 milliseconds, wherein a rate of increase of the light-emission output in said buffer irradiation step is between 10 and 40% of a rate of increase of the light-emission output until the light-emission output reaches a peak in said intense irradiation step.

7. The heat treatment method according to claim 6, further comprising: an additional irradiation step, subsequent to said intense irradiation step, of performing photo-irradiation of the substrate with a light-emission output that averages out at a fourth light-emission output that is lower than the third light-emission output and that is kept for 10 to 100 milliseconds within a fluctuation range of plus or minus 30% from the fourth light-emission output.

8. The heat treatment method according to claim 6, wherein the photo-irradiation of a substrate is performed with a flash lamp, power is supplied from a first capacitor to said flash lamp in said weak irradiation step and in said buffer irradiation step, and power is also supplied from a second capacitor, as well as the first capacitor, to said flash lamp in said intense irradiation step.

9. A heat treatment method for heating a substrate by irradiating the substrate with light, comprising: a buffer irradiation step of performing photo-irradiation of a substrate with a light-emission output that increases up to a first light-emission output over a time in a range of 1 to 100 milliseconds; and an intense irradiation step, subsequent to said buffer irradiation step, of performing photo-irradiation of the substrate in accordance with an output waveform that peaks at a second light-emission output that is higher than the first light-emission output and whose irradiation time is between 1 and 5 milliseconds, wherein a rate of increase of the light-emission output in said buffer irradiation step is between 10 and 40% of a rate of increase of the light-emission output until the light-emission output reaches a peak in said intense irradiation step.

10. The heat treatment method according to claim 9, further comprising: an additional irradiation step, subsequent to said intense irradiation step, of performing photo-irradiation of the substrate with a light-emission output that averages out at a third light-emission output that is lower than the second light-emission output and that is kept for 10 to 100 milliseconds within a fluctuation range of plus or minus 30% from the third light-emission output.

11. The heat treatment method according to claim 9, wherein the photo-irradiation of a substrate is performed with a flash lamp, and power is supplied from a first capacitor to said flash lamp in said buffer irradiation step, and power is also supplied from a second capacitor, as well as the first capacitor, to said flash lamp in said intense irradiation step.

12. A heat treatment method for heating a substrate by irradiating the substrate with light, comprising: a weak irradiation step of performing photo-irradiation of a substrate with a light-emission output that averages out at a first light-emission output and that is kept for 5 to 100 milliseconds within a fluctuation range of plus or minus 30% from the first light-emission output; a buffer irradiation step, subsequent to said weak irradiation step, of performing photo-irradiation of the substrate with a light-emission output that increases from the first light-emission output to a second light-emission output that is higher than the first light-emission output over a time in a range of 5 to 50 milliseconds; and an intense irradiation step, subsequent to said buffer irradiation step, of performing photo-irradiation of the substrate with a light-emission output that averages out at the second light-emission output and that is kept for 1 to 10 milliseconds within a fluctuation range of plus or minus 30% from the second light-emission output.

13. A heat treatment method for heating a substrate by irradiating the substrate with light, comprising: a buffer irradiation step of performing photo-irradiation of a substrate with a light-emission output that increases up to a first light-emission output over a time in a range of 1 to 100 milliseconds; and an intense irradiation step, subsequent to said buffer irradiation step, of performing photo-irradiation of the substrate with a light-emission output that averages out at the first light-emission output and that is kept for 1 to 10 milliseconds within a fluctuation range of plus or minus 30% from the first light-emission output.

14. A heat treatment method for heating a substrate by irradiating the substrate with light, comprising: a weak irradiation step of performing photo-irradiation of a substrate with a light-emission output that averages out at a first light-emission output and that is kept for 5 to 100 milliseconds within a fluctuation range of plus or minus 30% from the first light-emission output; a buffer irradiation step, subsequent to said weak irradiation step, of performing photo-irradiation of the substrate with a light-emission output that increases from the first light-emission output to a second light-emission output that is higher than the first light-emission output over a time in a range of 5 to 50 milliseconds; an intense irradiation step, subsequent to said buffer irradiation step, of performing photo-irradiation of the substrate with a light-emission output that averages out at the second light-emission output and that is kept for 5 to 10 milliseconds within a fluctuation range of plus or minus 30% from the second light-emission output; and an additional irradiation step, subsequent to said intense irradiation step, of performing photo-irradiation of the substrate with a light-emission output that averages out at a third light-emission output that is lower than the second light-emission output and that is kept for 10 to 100 milliseconds within a fluctuation range of plus or minus 30% from the third light-emission output.

15. A heat treatment method for heating a substrate by irradiating the substrate with light, comprising: a buffer irradiation step of performing photo-irradiation of a substrate with a light-emission output that increases up to a first light-emission output over a time in the range of 1 to 100 milliseconds; an intense irradiation step, subsequent to said buffer irradiation step, of performing photo-irradiation of the substrate with a light-emission output that averages out at the first light-emission output and that is kept for 5 to 10 milliseconds within a fluctuation range of plus or minus 30% from the first light-emission output; and an additional irradiation step, subsequent to said intense irradiation step, of performing photo-irradiation of the substrate with a light-emission output that averages out at a second light-emission output that is lower than the first light-emission output and that is kept for 10 to 100 milliseconds within a fluctuation range of plus or minus 30% from the second light-emission output.

* * * * *